(12) United States Patent
Kim et al.

(10) Patent No.: US 9,269,745 B2
(45) Date of Patent: Feb. 23, 2016

(54) LIGHT EMITTING DIODE HAVING A PLURALITY OF LIGHT EMITTING UNITS

(71) Applicant: Seoul Viosys Co., Ltd., Ansan-si (KR)

(72) Inventors: Jae Kwon Kim, Ansan-si (KR); Yeo Jin Yoon, Ansan-si (KR); Jong Kyu Kim, Ansan-si (KR); So Ra Lee, Ansan-si (KR); Sum Geun Lee, Ansan-si (KR); Hyun Haeng Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 110 days.

(21) Appl. No.: 14/087,140

(22) Filed: Nov. 22, 2013

(65) Prior Publication Data

US 2014/0145218 A1 May 29, 2014

(30) Foreign Application Priority Data

Nov. 23, 2012 (KR) .................. 10-2012-0133564
Dec. 27, 2012 (KR) .................. 10-2012-0155482

(51) Int. Cl.
| H01L 33/00 | (2010.01) |
| H01L 27/15 | (2006.01) |
| H01L 33/08 | (2010.01) |
| H01L 33/20 | (2010.01) |
| H01L 33/22 | (2010.01) |
| H01L 33/62 | (2010.01) |

(52) U.S. Cl.
CPC .............. *H01L 27/156* (2013.01); *H01L 33/08* (2013.01); *H01L 33/20* (2013.01); *H01L 33/22* (2013.01); *H01L 33/62* (2013.01)

(58) Field of Classification Search
None
See application file for complete search history.

(56) References Cited

U.S. PATENT DOCUMENTS

| 8,754,578 | B2 * | 6/2014 | Onushkin | ............. H01L 27/156 313/504 |
| 2005/0179130 | A1 * | 8/2005 | Tanaka et al. | .................. 257/730 |
| 2008/0303042 | A1 * | 12/2008 | Minato et al. | ................... 257/98 |
| 2010/0102336 | A1 * | 4/2010 | Lee et al. | .......... 257/88 |
| 2010/0289041 | A1 * | 11/2010 | Shakuda | ............... H01L 33/384 257/93 |
| 2011/0079795 | A1 * | 4/2011 | Nagai | .............. 257/77 |
| 2011/0204387 | A1 * | 8/2011 | Kim et al. | ........ 257/88 |
| 2011/0210311 | A1 * | 9/2011 | Kim et al. | ........ 257/13 |
| 2011/0316041 | A1 * | 12/2011 | Narita et al. | ................... 257/103 |

FOREIGN PATENT DOCUMENTS

KR  10-2011-0024762  3/2011

* cited by examiner

*Primary Examiner* — Benjamin Sandvik
(74) *Attorney, Agent, or Firm* — H.C. Park & Associates, PLC

(57) ABSTRACT

Exemplary embodiments of the present invention provide a light emitting diode including light emitting units disposed on a substrate, and wires connecting the light emitting units to each other, wherein the light emitting units each include a parallelogram-shaped light emitting unit having two acute angles and two obtuse angles, or a triangular light emitting unit having three acute angles.

31 Claims, 22 Drawing Sheets

LIGHT EMITTING DIODE HAVING A PLURALITY OF LIGHT EMITTING UNITS

CROSS-REFERENCE TO RELATED APPLICATIONS

This application claims priority from and the benefit of Korean Patent Application Nos. 10-2012-0133564, filed on Nov. 23, 2012, and 10-2012-0155482, filed on Dec. 27, 2012, which are hereby incorporated by reference for all purposes as if fully set forth herein.

BACKGROUND

1. Field

Exemplary embodiments of the present invention relate to a light emitting diode and, more particularly, to a light emitting diode having a plurality of light emitting units.

2. Discussion of the Background

Light emitting diodes are widely used for display devices and backlight units. With low power consumption and long lifespan as compared with existing incandescent lamps or fluorescent lamps, light emitting diodes have expanded application ranges to general lighting by replacing existing incandescent lamps, fluorescent lamps, and the like.

A light emitting diode may be driven by forward current and thus repeats on/off operation according to a direction of electric current provided under an alternating current (AC) source. Thus, when the light emitting diode is directly connected to the AC source, the light emitting diode may not continuously emit light and may be easily damaged by reverse current. Moreover, a single light emitting diode may be driven by a predetermined forward voltage and thus may not be driven under high voltage conditions.

A light emitting diode capable of being driven under high voltage AC conditions has been developed. Such a light emitting diode may include a plurality of light emitting units having a substantially square or rectangular shape and connected to one another in series by interconnection wires, and thus, the light emitting diode may be driven by high voltage. Further, a serial array of light emitting units may be connected to a rectifier circuit such as a bridge rectifier, thereby providing a light emitting diode which may be driven by an AC source.

However, a typical light emitting diode having a plurality of light emitting units may have relatively low luminous efficacy.

Korean Patent Publication No. 2011-0024762A discloses a technique for improving light extraction efficiency, in which a convex-concave pattern is formed on a substrate as in a patterned sapphire substrate (PSS), such that semiconductor layers may be grown on the convex-concave pattern. However, this technique has a limit in improving light extraction efficiency only through formation of the convex-concave pattern.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a light emitting diode having improved light extraction efficiency.

Exemplary embodiments of the present invention also provide a light emitting diode including a plurality of light emitting units and having improved light extraction efficiency.

Exemplary embodiments of the present invention also provide a light emitting diode capable of reducing optical loss caused by components of the light emitting diode.

Additional features of the invention will be set forth in the description which follows, and in part will be apparent from the description, or may be learned by practice of the invention.

An exemplary embodiment of the present invention provides a light emitting diode including light emitting units disposed on a substrate, and wires connecting the light emitting units to each other, wherein the light emitting units each include a parallelogram-shaped light emitting unit having two acute angles and two obtuse angles, or a triangular light emitting unit having three acute angles.

An exemplary embodiment of the present invention provides a method of fabricating a light emitting diode, the method including preparing a substrate, forming a stack including a first conductivity-type semiconductor layer, an active layer, and a second conductivity-type semiconductor layer on the substrate, and patterning the stack to form light emitting units. The light emitting units each include a parallelogram-shaped light emitting unit having two acute angles and two obtuse angles, or a triangular light emitting unit having three acute angles.

An exemplary embodiment of the present invention provides a light emitting diode including light emitting units disposed on a substrate. The light emitting units each include a parallelogram-shaped light emitting unit having two acute angles and two obtuse angles, or a triangular light emitting unit having three acute angles, the substrate includes a convex-concave pattern including convexities and concavities defined by the convexities on a first surface thereof, and the convex-concave pattern is disposed in a first region on the first surface of the substrate and includes fine convexities and concavities disposed on surfaces of the convex-concave pattern.

It is to be understood that both the foregoing general description and the following detailed description are exemplary and explanatory and are intended to provide further explanation of the invention as claimed.

BRIEF DESCRIPTION OF THE DRAWINGS

The above and other aspects, features, and advantages of the present invention will become apparent from the detailed description of the following exemplary embodiments in conjunction with the accompanying drawings.

DETAILED DESCRIPTION OF THE ILLUSTRATED EMBODIMENTS

Figure 1:
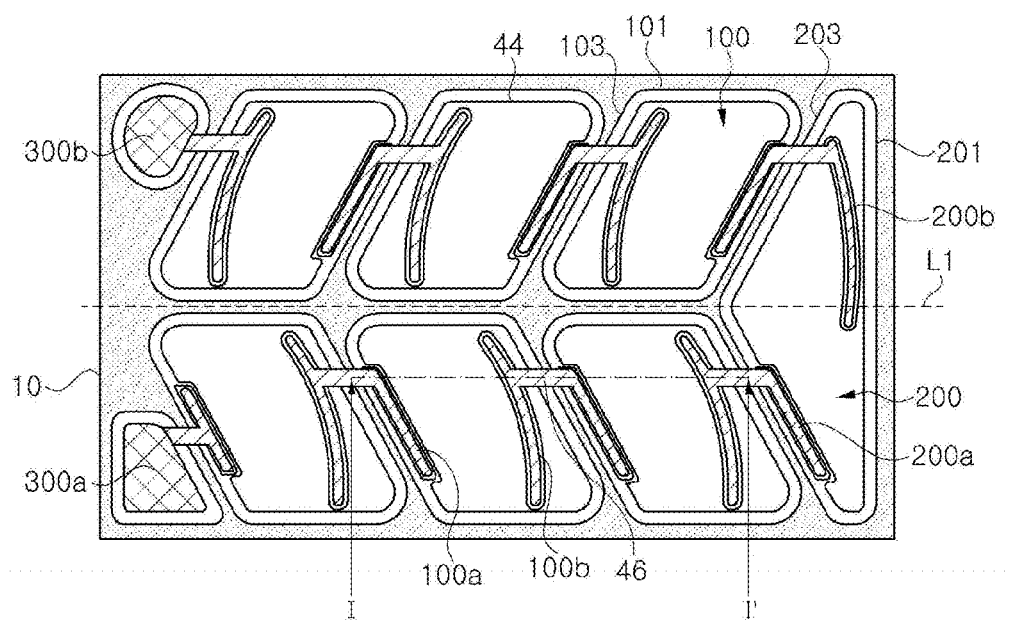
FIG. 1 is a schematic plan view of a light emitting diode according to an exemplary embodiment of the present invention.

Exemplary embodiments of the present invention will be described in more detail with reference to the accompanying drawings. It should be understood that the following exemplary embodiments are given by way of illustration only to provide thorough understanding of the invention to those skilled in the art. Therefore, the present invention is not limited to the following exemplary embodiments and may be embodied in different ways. Further, like components will be denoted by like reference numerals throughout the specification, and the widths, lengths, and thicknesses of certain elements, layers or features may be exaggerated for clarity.

It will be understood that when an element is referred to as being placed "above" or "on" another element, it can be directly placed on the other element, or an intervening layer(s) may also be present. In other words, the expressions of spatial orientations are to be construed as indicating relative orientations instead of absolute orientations. In addition, it will be understood that, although the terms "first", "second", etc. may be used herein to distinguish various elements, components, regions, layers and/or sections from one another, these elements, components, regions, layers and/or sections should not be limited by these terms. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
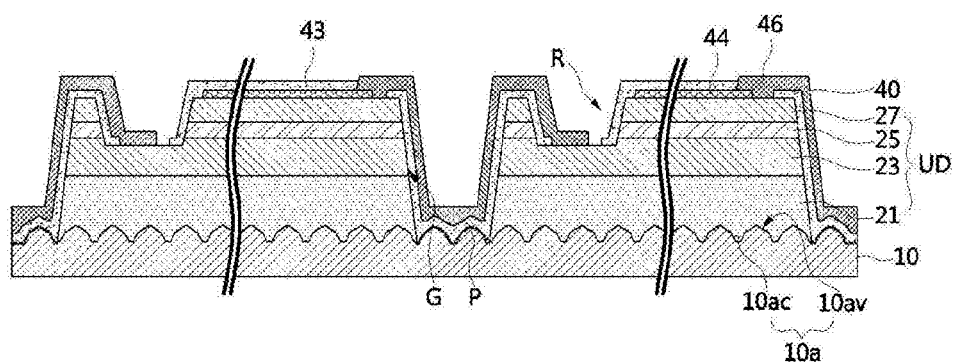
FIG. 2 is a sectional view, taken along line I-I', of the light emitting diode according to the exemplary embodiment of FIG. 1.
Figure 3:
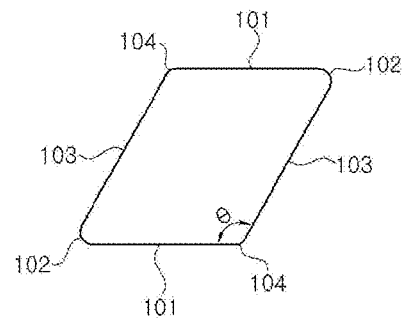
FIG. 3 is a schematic plan view of a parallelogram-shaped light emitting unit.

FIG. 1 and FIG. 2 are a schematic plan view and a schematic sectional view of a light emitting diode according to an exemplary embodiment of the present invention, respectively, and FIG. 3 is a schematic view of a light emitting unit 101 shown in FIG. 1.

Referring to FIG. 1, FIG. 2, and FIG. 3, a light emitting diode according to an exemplary embodiment of the present invention includes a substrate 10, a plurality of light emitting units UD 100, 200 and interconnection wires 46. The light emitting diode may further include first and second electrode pads 300a, 300b. Each of the light emitting units 100, 200 may include a current spreading conductive layer 44 formed on an upper side thereof, a first electrode 100a or 200a and a second electrode 100b or 200b. Further, the light emitting diode may include a passivation layer 43 and an isolation layer 40.

The substrate 10 may be a sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon substrate. The substrate 10 may be an insulating substrate such as a sapphire substrate, or a conductive substrate with an insulating layer formed thereon.

The substrate 10 generally has a quadrilateral shape, for example, a rectangular shape, as shown in the drawings. As referred to herein, the shapes of the substrate 10 and the light emitting units 100, 200, that is, shapes such as a quadrilateral shape, a parallelogram shape, a triangular shape, and the like, are shapes in plan view. Here, a polygonal shape such as a triangular shape, a quadrilateral shape or a parallelogram shape may include a slightly modified polygonal shape. For example, such a polygonal shape may have a rounded angle portion.

As used herein, the term "parallelogram shape" is a quadrilateral shape having acute angles and obtuse angles unlike a rectangular shape. The acute angle portions may be rounded to have a greater curvature than the obtuse angle portions. In addition, as used herein, the "triangular shape" has three acute angles, and acute angle portions of the triangular shape may also be rounded. The triangular shape with three acute angles may be an equilateral triangular shape.

Since the light emitting units may have a parallelogram shape or a triangular shape, the light emitting diode may reduce optical loss occurring at side surfaces of the light emitting units, and optical loss due to optical interference between the light emitting units or optical absorption.

The substrate 10 may include a convex-concave pattern 10a formed on an upper surface thereof and including concavities Mac and convexities 10av, and some of the convex-concave pattern 10a placed in a partial region may include fine convexities and concavities P formed on a surface thereof. Particularly, the convex-concave pattern 10a having the fine convexities and concavities P may be formed in a region excluding lower regions of the light emitting units UD, for example, in an isolation groove G that isolates the light emitting units UD from each other. In addition, as will be described below, the region of the convex-concave pattern 10a, in which the fine convexities and concavities P are formed, may be formed under a mesa-etched region R of the light emitting units UD. The fine convexities and concavities P may be irregularly formed. The fine convexities and concavities P may alternatively be regularly formed.

The plurality of light emitting units UD may include at least one light emitting unit 100 having a parallelogram shape having two acute angles and two obtuse angles, and at least one light emitting unit 200 having a triangular shape. As shown in FIG. 1, the parallelogram-shaped light emitting units 100 having two acute angles and two obtuse angles may be arranged in two rows such that the first and second rows have the same number of light emitting units 100 arranged therein.

When the substrate 10 has a rectangular shape, two sides of each of the parallelogram-shaped light emitting units 100 are parallel to two sides of the substrate 10, and two other sides thereof are not parallel to any side of the substrate 10. As shown in FIG. 3, the light emitting unit 100 includes first sides 101 (see FIG. 3) facing each other and second sides 103 (see FIG. 3) facing each other. Here, the light emitting units 100 are arranged on the substrate 10 such that the first sides 101 are parallel to edges of the substrate 10 and the second sides 103 are not parallel to any edge of the substrate 10.

As shown in FIG. 3, an obtuse angle defined between the first side 101 and the second side 103 may be greater than 90° and equal to or less than 135°. As the obtuse angle (θ) approaches 135°, the light emitting diode has further improved light extraction efficiency. As such, when the light emitting unit has a parallelogram shape, optical loss within each of the light emitting units is reduced, thereby reducing optical loss by optical interference between the light emitting units and optical absorption by the light emitting units. Here, an obtuse angle θ greater than 135° may make it difficult to achieve uniform spreading of electric current over the region of the light emitting units. In the parallelogram-shaped light emitting units, acute angle portions and obtuse angle portions may be rounded. Particularly, the acute angle portions and the obtuse angle portions may be rounded such that the acute angle portions have a greater curvature (1/radius) than the obtuse angle portions.

Referring again to FIG. 1, the first row of the light emitting units 100 and the second row of the light emitting units 100 may be disposed to have a mirror symmetrical structure relative to a mirror plane passing through a dotted line L1 to be perpendicular to the substrate 10. Here, the overall contours of the parallelogram-shaped light emitting units have a mirror symmetrical structure and it is not necessary for all of the interconnection wires 46 and electrodes 100a, 100b to have a symmetry structure. As shown, the first and second rows of light emitting units 100, 100 are disposed such that sides facing each other are parallel to each other.

The triangular light emitting unit 200 may be placed over the first row and the second row. As the light emitting units 100 are arranged in the first and second rows, the light emitting units 100 provide a protruding contour at one end of each row and a recessed contour at the other end thereof. The triangular light emitting unit 200 is disposed near one side edge of the substrate 10 to fill the recessed contour.

For example, the triangular light emitting unit 200 may have an isosceles triangular shape that has a long side 201 and two other sides 203 having the same length. The triangular light emitting unit 200 may be disposed such that the long side 201 is parallel to the one side edge of the substrate 10. One of the sides 203 may be parallel to the second side 103 of the light emitting units 100 in the first row, and the other side 203 may be parallel to the second side of the light emitting unit 100 in the second row.

As shown in FIG. 1, the plurality of light emitting units may be composed of six parallelogram-shaped light emitting units 100 and a single triangular light emitting unit 200. For example, more light emitting units may be arranged in two rows by increasing the number of parallelogram-shaped light emitting units 100 disposed in each row. A plurality of light emitting diodes including seven light emitting units as shown in FIG. 1 may be electrically connected to each other, thereby providing a light emitting module that can be operated by a high voltage AC such as 110V or 220V AC.

As shown in FIG. 2, each of the light emitting units UD may have a stack, which includes a first conductivity-type semiconductor layer 23, an active layer 25 and a second conductivity-type semiconductor layer 27, and which may further include a buffer layer 21. In addition, in each of the light emitting units UD, at least one of the first conductivity-type semiconductor layer 23, the active layer 25, and the second conductivity-type semiconductor layer 27 may have a side surface inclined at an angle of less than 90° relative to a surface of the substrate 10.

The active layer 25 may have a single quantum-well structure or a multi-quantum well structure, and may have a composition determined depending upon a desired wavelength of light generated therein. For example, the active layer 25 may be formed of an AlInGaN-based compound semiconductor, for example, InGaN. On the other hand, the first and second conductivity-type semiconductor layers 23, 27 may be formed of a material having a greater band gap than the active layer 25, and may be formed of an AlInGaN-based compound semiconductor, for example, GaN.

As shown, the second conductivity-type semiconductor layer 27 is formed on a partial region of the first conductivity-type semiconductor layer 23, and the active layer 25 is disposed between the second conductivity-type semiconductor layer 27 and the first conductivity-type semiconductor layer 23. Further, the second conductivity-type semiconductor layer 27 may have a current spreading conductive layer, for example, a transparent electrode layer 44, formed on an upper side thereof. The transparent electrode layer 44 may be formed of indium tin oxide (ITO), Ni/Au, and the like.

The first and second conductivity-type semiconductor layers 23, 27 may be an n-type semiconductor layer and a p-type semiconductor layer, respectively, or vice versa. The first electrodes 100a, 200a (see FIG. 1) are formed on the first conductivity-type semiconductor layer 23, and the second electrodes 100b, 200b (see FIG. 1) are formed on the second conductivity-type semiconductor layer 27. The second electrodes 100b, 200b may be formed on the transparent electrode layer 44. As shown in FIG. 1, the first electrode 100a and the second electrode 100b are disposed to face each other.

The first electrode 100a may have a linear shape, and the second electrodes 100b, 200b may have a curved shape. The second electrode 100b is formed at one end thereof near the obtuse angle portion, and at the other end thereof near the acute angle portion, wherein the other end of the second electrode 100b disposed near the acute angle portion is further distant from the angle portion than the one end disposed near the obtuse angle portion. The curved shape of the second electrodes 100b, 200b can improve current spreading within the light emitting unit, thereby improving luminous efficacy. On the other hand, the interconnection wire 46 is connected to the second electrode 100b in a state of being biased towards the obtuse angle portion. Accordingly, the interconnection wires 46 may have a relatively short length, thereby reducing blockage of light by the interconnection wires 46.

On the other hand, a first electrode pad 300a and a second electrode pad 300b are disposed on the substrate 10. The first and second electrode pads 300a, 300b may be arranged in the two rows. In addition, as shown in FIG. 1, the first and second electrode pads 300a, 300b are formed near the other side edge of the substrate 10 opposite the one side edge of the substrate 10 at which the triangular light emitting units 100 are formed.

The first and second electrode pads 300a, 300b may be formed on the substrate 10, the first conductivity-type semiconductor layer 23, the second conductivity-type semiconductor layer 27 or the transparent electrode layer 44 to be separated from light emitting units 300, 400.

Alternatively, the first and second electrode pads 300a, 300b may be disposed on the light emitting units 100 or 200. In the present exemplary embodiment, the first and second electrode pads 300a, 300b are separated from the light emitting units 100, 200, whereby light emitted from the light emitting units can be prevented from being blocked by the first and second electrode pads, thereby improving light extraction efficiency.

The first and second electrode pads 300a, 300b are pads for supplying electric power from an external power source, and may be bonded to, for example, bonding wires. The light emitting diode is driven by power applied to the first and second electrode pads 300a, 300b.

The interconnection wires 46 electrically connect adjacent light emitting units 100, 200 to each other. The interconnection wires 46 may connect the adjacent light emitting units 100, 200 to each other in series. That is, the interconnection wires 46 connect the first electrode 100a of one light emitting unit to the second electrode 100b of another light emitting unit adjacent thereto. The interconnection wires 46 and the electrodes 100a, 100b, 200a, 200b may be formed of the same materials by the same process. The passivation layer 43 covers the transparent electrode layer 44 while partially exposing the transparent electrode layer 44 therethrough. In addition, the passivation layer 43 may cover a side surface of the light emitting units UD exposed to the mesa-etched region R. The isolation layer 40 may cover an upper surface of the substrate 10 and the side surfaces of the light emitting units UD exposed in the isolation groove G. The isolation layer 40 prevents the second conductivity-type semiconductor layer 27 and the first conductivity-type semiconductor layer 23 from suffering a short circuit by the interconnection wires 46. The passivation layer 43 and the isolation layer 40 may be formed of the same materials by the same process.

As shown in FIG. 2, a protrusion of a semiconductor stack may be interposed between the mesa-etched region R and the isolation groove G. Alternatively, the mesa-etched region R and the isolation groove G may be formed directly adjacent each other without the protrusion of the semiconductor stack. Thus, the lengths of the interconnection wires 46 can be decreased, thereby reducing optical absorption by the interconnection wires 46.

Figure 4:
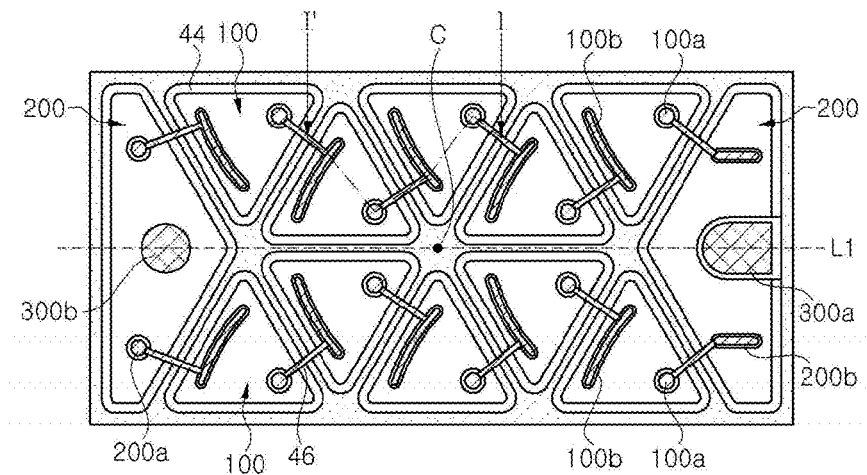
FIG. 4 is a schematic plan view of a light emitting diode according to an exemplary embodiment of the present invention.
Figure 5:
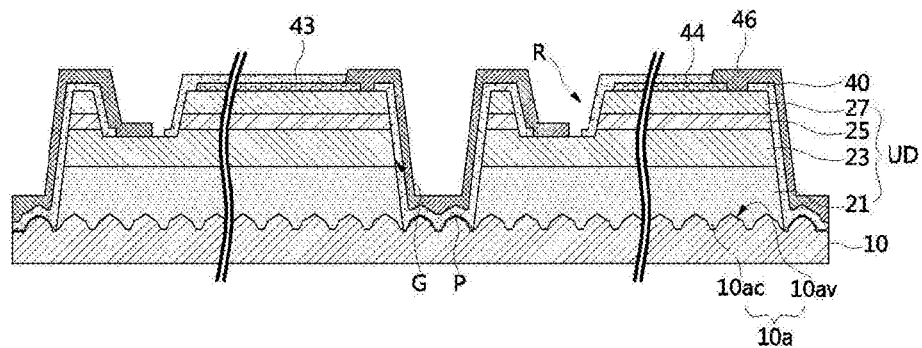
FIG. 5 is a sectional view, taken along line I-I', of the light emitting diode according to the exemplary embodiment of FIG. 4.

FIG. 4 and FIG. 5 are a schematic plan view and a sectional view of a light emitting diode according to an exemplary embodiment of the present invention.

Referring to FIG. 4 and FIG. 5, the light emitting diode according to the present exemplary embodiment includes a substrate 10, a plurality of light emitting units (UD) 100, 200, and interconnection wires 46 as in the light emitting diode described with reference to FIG. 1, FIG. 2, and FIG. 3. In the present exemplary embodiment, however, the light emitting units 100 are triangular light emitting units that have three acute angles, and the light emitting units 200 are triangular or pentagonal light emitting units having obtuse angles.

In addition, as described with reference to FIG. 1, FIG. 2, and FIG. 3, the light emitting diode may include first and second electrode pads 300a, 300b, and each of the light emitting units 100, 200 may have a current spreading conductive layer 44 placed thereon. In addition, each of the light emitting units 100 may have a first electrode 100a and a second electrode 100b, and each of the light emitting units 200 may have a first electrode 200a and a second electrode 200b. Further, the light emitting diode may include a passivation layer 43 and an isolation layer 40.

The material and shape of the substrate 10, and the convex-concave pattern 10a formed on the upper side of the substrate are similar to those of the exemplary embodiment described above with reference to FIG. 1, FIG. 2, and FIG. 3.

The plurality of light emitting units UD include triangular light emitting units 100 having three acute angles, and may also include triangular or pentagonal light emitting units 200 having obtuse angles.

When the substrate 10 has a rectangular shape, two sides of each of the triangular light emitting units 100 are parallel to two sides of the substrate 10, and two other sides thereof are not parallel to any side of the substrate 10. The light emitting units 100 may have a regular triangular shape. At least six light emitting units 100 may be radially arranged about one point. The one point may be placed near a central portion, or may be a center C of the substrate, which may be marked or unmarked. Although only six light emitting units 100 are illustrated as being radially arranged in FIG. 4, this arrangement may be further provided by increasing the number of light emitting units 100.

By the triangular light emitting units 100 having acute angles, the light emitting diode has improved light extraction efficiency through the acute angle portions. In addition, at least six light emitting units 100 are radially arranged and the acute angle portions are rounded, whereby optical loss can be reduced near the center C of the substrate at which the at least six light emitting units are gathered, thereby improving light extraction efficiency.

As shown in FIG. 4, the light emitting units 100 may be arranged at both sides of a straight line L1 passing through the center (C) and may be arranged in a mirror symmetrical structure relative to a vertical plane passing through the center (C).

The light emitting units 100 arranged at both sides of the straight line L1 are connected to each other by the interconnection wires 46 to form two serial arrays. These serial arrays may be arranged in a mirror symmetrical structure, whereby not only the light emitting units 100 but also the interconnection wires 46 and the electrodes 100a, 100b are all arranged in a mirror symmetry structure.

The triangular or pentagonal light emitting units 200 may be disposed near opposite side edges of the substrate 10. With the symmetry arrangement of the light emitting units 100, concave contours may be formed near the opposite side edges of the substrate 10 by the light emitting units 100. The triangular or pentagonal light emitting unit 200 may be disposed near each side edge of the substrate 10 such that the concave contour can be filled therewith.

The first electrode pad 300a is formed on the light emitting unit 200 at one side edge of the substrate, and the second electrode pad 300b is placed on the light emitting unit 200 at the other side edge thereof. The serial array of the light emitting units 100, 200 are connected in parallel to each other between the first electrode pad 300a and the second electrode pad 300b. Since the serial arrays are connected in parallel to each other, the light emitting diode allows uniform current spreading, thereby improving current injection efficiency between the light emitting units 100, 200.

As shown in FIG. 4, the light emitting units 200 are disposed at opposite ends of each of the serial arrays, such that the triangular light emitting units 100 having acute angles are placed therebetween. In the present exemplary embodiment, five light emitting units 100 and two light emitting units 200 are connected to each other to constitute a serial array. Alternatively, more light emitting units may be connected to each other in series by increasing the number of light emitting units 100 disposed in each of the arrays. For example, as shown in FIG. 4, a plurality of light emitting diodes each including seven light emitting units may be electrically connected to each other, thereby providing a light emitting module that can be operated by a high voltage AC, such as 110V or 220V AC.

As shown in FIG. 5, each of the light emitting units UD may have a stack, which includes a first conductivity-type semiconductor layer 23, an active layer 25, and a second conductivity-type semiconductor layer 27, and which may further include a buffer layer 21. In addition, in each of the light emitting units UD, at least one of the first conductivity-type semiconductor layer 23, the active layer 25, and the second conductivity-type semiconductor layer 27 may have a side surface inclined at an angle of less than 90° relative to a surface of the substrate 10. The active layer 25, first conductivity-type semiconductor layer 23, and second conductivity-type semiconductor layer 27 are the same as those described with reference to FIG. 2, and thus, a repeated description thereof will be omitted.

In the present exemplary embodiment, the first electrodes 100a, 200a (see FIG. 4) are formed on the first conductivity-type semiconductor layer 23, and the second electrodes 100b, 200b (see FIG. 4) are placed on the second conductivity-type semiconductor layer 27. The first electrode 100a or 200a may be electrically connected to the first conductivity-type semiconductor layer 23 through a groove, which is formed through the second conductivity-type semiconductor layer 27 and the active layer 25. The second electrodes 100b, 200b may be formed on the transparent electrode layer 44. As shown in FIG. 4, the first electrode 100a and the second electrode 100b are disposed to face each other.

The first electrodes 100a may have a dot shape and the second electrodes 100b may have a curved shape. The second electrodes 100b are disposed along one side of a triangular shape. The curved shape of the second electrodes 100b can improve current spreading within the light emitting unit, thereby improving luminous efficacy. On the other hand, the interconnection wire 46 is connected to the second electrode 100b in a state of being biased towards the acute angle portion. Accordingly, the interconnection wires 46 may have a relatively short length, thereby reducing blockage of light by the interconnection wires 46.

The first and second electrode pads 300a, 300b are pads for supplying electric power from an external power source, and may be bonded to, for example, bonding wires. The light emitting diode is driven by power applied to the first and second electrode pads 300a, 300b.

The interconnection wires 46, the passivation layer 43 and the isolation layer 40 are similar to those of the light emitting diode described with reference to FIG. 1, FIG. 2, and FIG. 3, and thus, repeated descriptions thereof will be omitted.

As shown in FIG. 5, a protrusion of a semiconductor stack may be interposed between the mesa-etched region R and the isolation groove G. Alternatively, the mesa-etched region R and the isolation groove G may be formed directly adjacent each other without the protrusion of the semiconductor stack.

Thus, the lengths of the interconnection wires 46 can be decreased, thereby reducing optical absorption by the interconnection wires 46.

Figure 6:
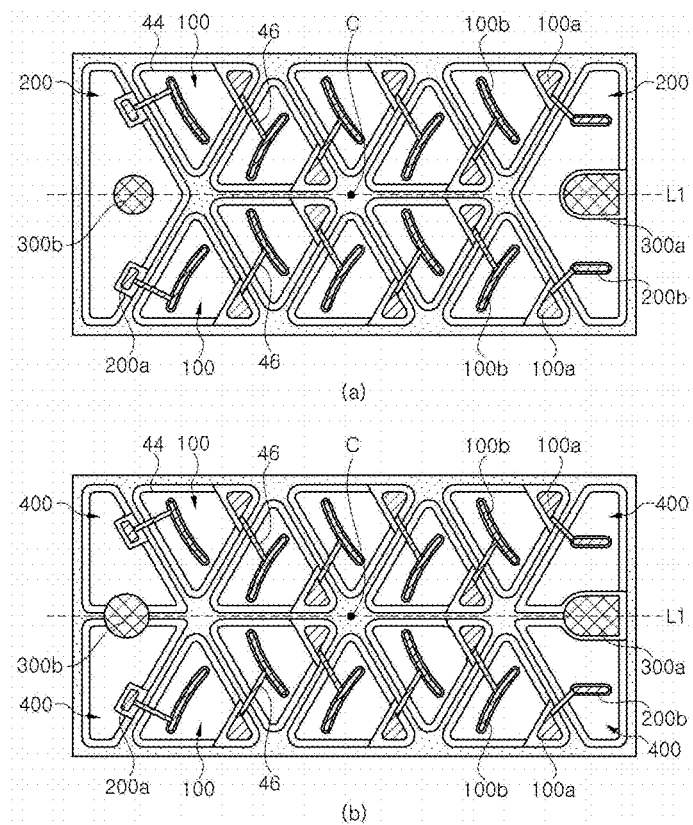
FIG. 6(a) and FIG. 6(b) are schematic plan views of a light emitting diode according to exemplary embodiments of the present invention.

FIG. 6(a) and FIG. 6(b) are schematic plan views of light emitting diodes according to exemplary embodiments of the invention. In these exemplary embodiments, the mesa-etched region R is formed directly adjacent the isolation groove G.

Referring to FIG. 6(a), the light emitting diode according to this exemplary embodiment is generally similar to the light emitting diode shown in FIG. 4 and FIG. 5 except that first electrodes 100a, 200a are formed in the mesa-etched region R near the isolation groove G.

Referring to FIG. 6(b), the light emitting diode according to this exemplary embodiment is generally similar to the light emitting diode of FIG. 6(a) except that the light emitting units 200 of FIG. 6(a) are divided into two light emitting units 400 relative to the line L1. Here, each of the first electrode pad 300a and the second electrode pad 300b may be formed over two light emitting units 400 between these light emitting units 400.

Next, a method of fabricating a light emitting diode according to an exemplary embodiment of the present invention will be described. The following method may be applied not only to the light emitting diode described with reference to FIG. 1, FIG. 2, and FIG. 3, but also to the light emitting diode described with reference to FIG. 4 or FIG. 6.

FIG. 7(a), FIG. 7(b), FIG. 7(c), FIG. 7(d), FIG. 7(e), FIG. 7(f), FIG. 7(g), FIG. 7(h), FIG. 7(i), and FIG. 7j are sectional views illustrating a method of fabricating a light emitting diode according to an exemplary embodiment of the present invention. Specifically, FIG. 7(a) to FIG. 7(e) are sectional views illustrating a method of forming a convex-concave pattern within a substrate, and FIG. 7(f) to FIG. 7(j) are sectional view illustrating a method of fabricating a light emitting diode using the substrate having the convex-concave pattern.

Figure 7A:
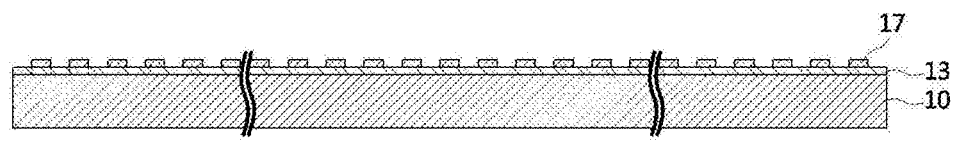
FIG. 7(a), FIG. 7(b), FIG. 7(c), FIG. 7(d), FIG. 7(e), FIG. 7(f), FIG. 7(g), FIG. 7(h), FIG. 7(i), and FIG. 7(j) are sectional views illustrating a method of fabricating a light emitting diode according to an exemplary embodiment of the present invention.

Referring to FIG. 7(a), a substrate 10 is prepared. The substrate 10 may be may be a sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon substrate. The substrate 10 may be a sapphire substrate.

An etching mask layer 13 is formed on an upper surface of the substrate 10. The etching mask layer 13 may be a silicon oxide layer, a silicon nitride layer or a silicon nitride oxide layer. However, the etching mask layer 13 may be formed of any material having etching selectivity with respect to the substrate 10. A photoresist pattern 17 may be formed on the etching mask layer 13.

Figure 7B:
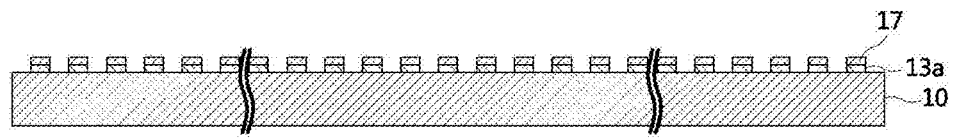

Referring to FIG. 7(b), the etching mask layer 13 may be subjected to wet etching or dry etching using the photoresist pattern 17 as a mask. As a result, an etching mask pattern 13a may be formed. When the etching mask layer 13 is a silicon oxide layer, the etching mask layer 13 may be etched using a HF or BOE (buffered oxide etchant) solution.

Figure 8:
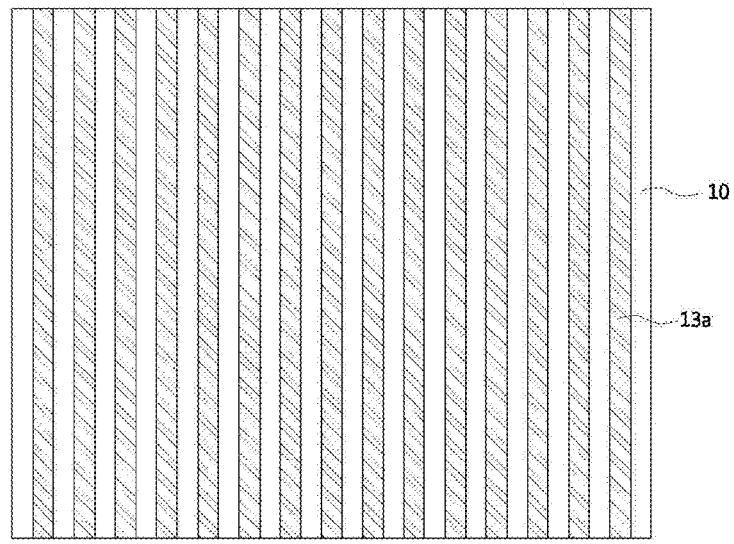
FIG. 8, FIG. 9, and FIG. 10 are schematic plan views of mask patterns for etching.
Figure 9:
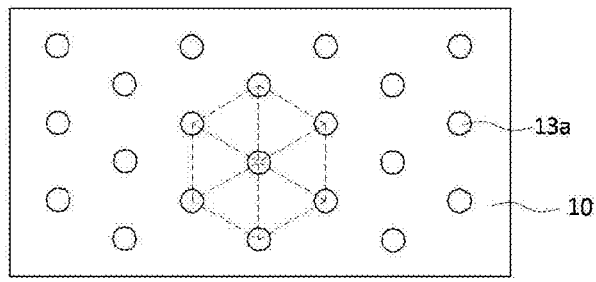
Figure 10:
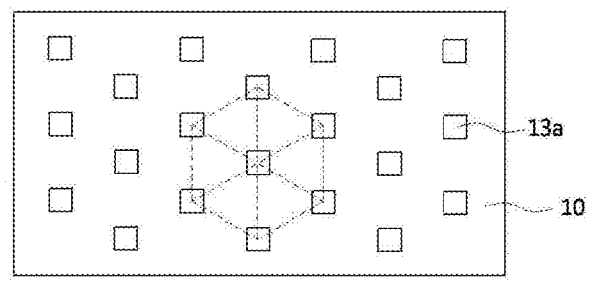

The etching mask pattern 13a may be formed in various shapes. For example, the etching mask pattern 13a may have a stripe shape (FIG. 8), a circular island shape (FIG. 9), or a polygonal island shape (FIG. 10), as shown in FIG. 8, FIG. 9, and FIG. 10. When unit patterns of the etching mask pattern 13a have an island shape, the unit patterns of the etching mask pattern 13a may be disposed such that six unit patterns surround a single unit pattern in a hexagonal arrangement.

Figure 7C:
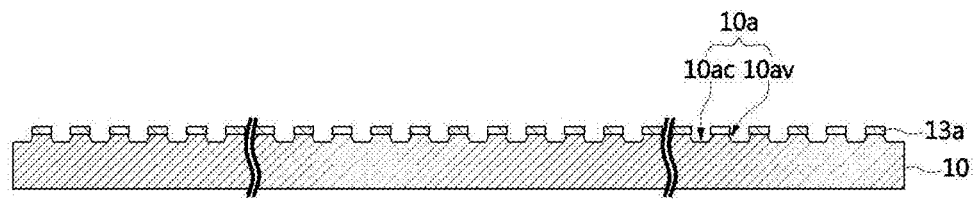

Referring to FIG. 7(c), the etching mask pattern 13a may be exposed by removing the photoresist pattern 17. With the etching mask pattern 13a as a mask, the substrate 10 may be subjected to primary etching to form a convex-concave pattern 10a including concavities 10ac and convexities 10av on the upper surface of the substrate 10. The substrate 10 may be etched by wet etching.

An etching solution used for wet etching may exhibit significantly different etching rates dependent upon a crystal direction of the substrate 10. In other words, the etching solution may preferentially etch the substrate 10 in a specific crystal direction. By way of example, when the substrate 10 is a sapphire substrate or a GaN substrate, the etching solution may be a mixture of sulfuric acid and phosphoric acid, a mixture of nitric acid and phosphoric acid, or a KOH solution. When the substrate 10 is a SiC substrate, the etching solution may be a BOE (buffered oxide etchant) or HF solution, and when the substrate 10 is a Si substrate, the etching solution may be a KOH solution. When the substrate 10 is a c-plane sapphire substrate and the etching solution is a mixture of sulfuric acid and phosphoric acid in a volume ratio of 3:1, the c-plane may be etched in the course of wet etching. In this case, bottom surfaces of the concavities Mac and upper surfaces of the convexities 10av may be c-planes.

Figure 7D:
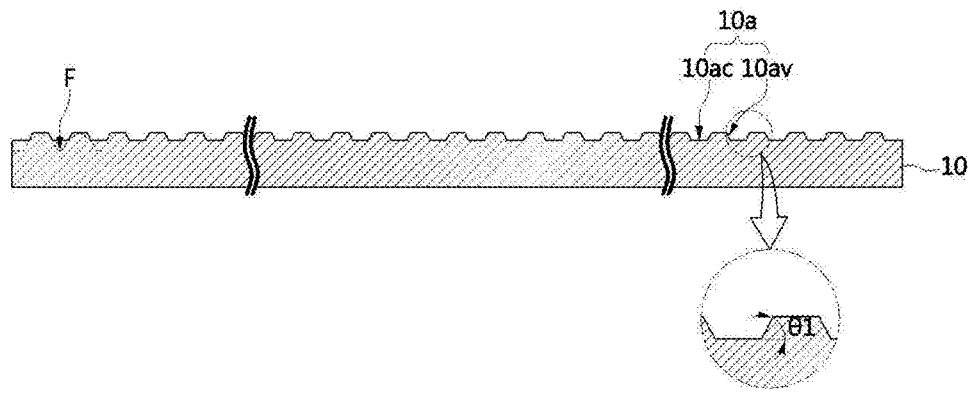

Referring to FIG. 7d, the upper surfaces of the convexities 10av are exposed by removing the etching mask pattern 13a. The upper surfaces of the convexities 10av may be planar surfaces, and facets thereof may have a first inclined angle θ1 relative to the surface of the substrate. Such facets may be first crystal planes. In addition, the angles of the facets of the convexities 10av inclined relative to the surface of the substrate, that is, sloped angles of the facets of the convexities 10av, may be identical or may be different dependent upon the facets thereof. Further, bottom surfaces of the concavities Mac placed between the convexities 10av may be coplanar with the surface of the substrate.

Figure 7E:
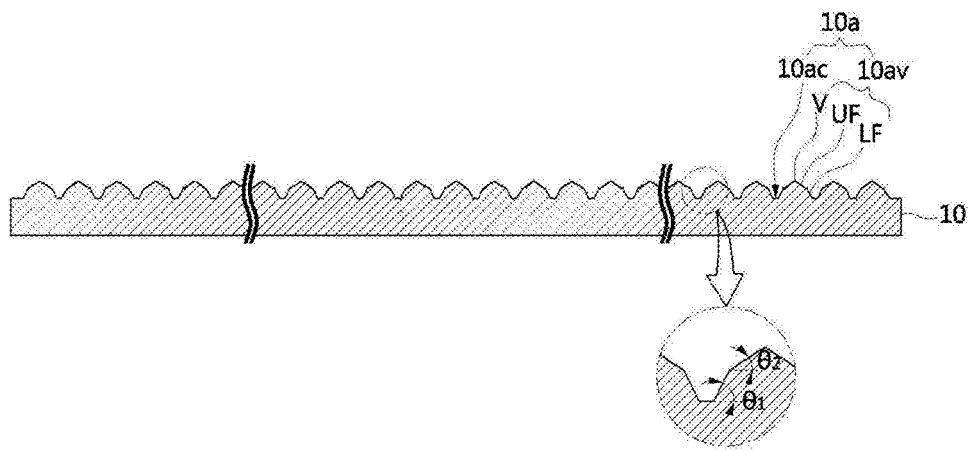

Referring to FIG. 7(e), the substrate 10 having the convex-concave pattern 10a may be subjected to secondary etching. As a result, the convexities 10av may be changed to have lower facets LF, which are first crystal planes, and upper facets UF, which are second crystal planes different than the first crystal plane, in which the second crystal planes meet to form an upper vertex V.

Secondary etching may also be wet etching. An etching solution used in secondary etching may be the same or different from the etching solution used in primary etching. When the etching solution used in secondary etching is different from the etching solution used in primary etching, a crystal plane different from the crystal plane of the substrate preferentially etched in primary etching may be preferentially etched. On the other hand, when the etching solution used in secondary etching is the same as the etching solution used in primary etching, the bottom surfaces of the concavities 10ac are continuously etched, whereby the first crystal planes of the convexities 10av are extended towards the substrate 10, thereby forming the lower facets LF.

On the other hand, in upper regions of the convexities 10av, the first crystal planes formed in the course of primary etching are also gradually etched, whereby other crystal planes, that is, the second crystal planes, can be exposed, thereby forming the upper facets UF. Such secondary etching may be performed until all of the upper surfaces of the convexities 10av are etched and the upper vertex V formed where the second crystal planes meet can be formed (see dotted line F of FIG. 7(d)).

Figure 11:
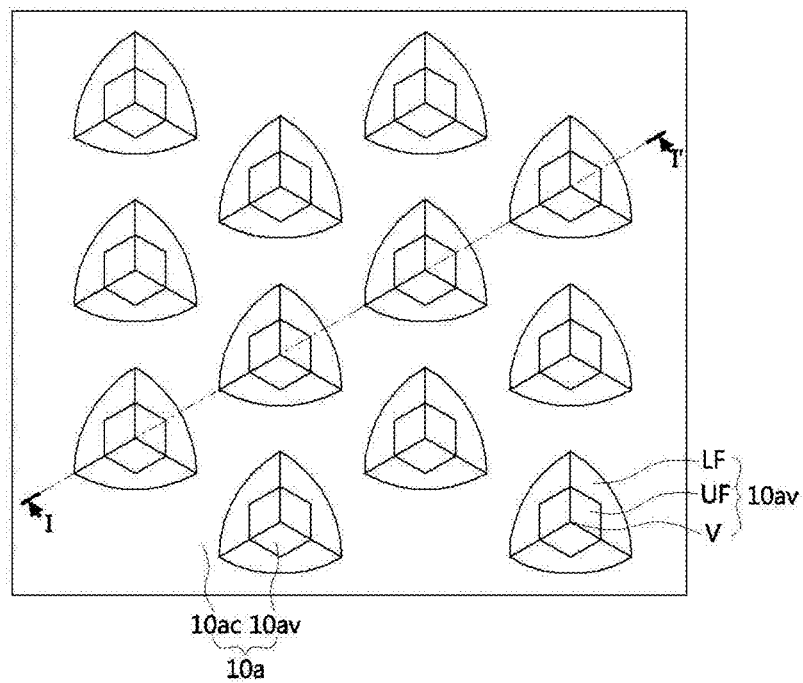
FIG. 11 is a plan view of a convex-concave pattern according to an exemplary embodiment of the present invention.
Figure 12:
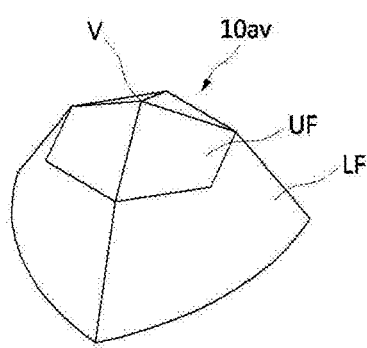
FIG. 12 is a perspective view of one convex-concave pattern shown in FIG. 11.

Referring to FIG. 11 and FIG. 12, the convex-concave pattern will be described in more detail. FIG. 7(e) is a cross-sectional view taken along line I-I' of FIG. 11. In addition, FIG. 12 is a perspective view of one convexity.

Referring to FIG. 7(e), FIG. 8 and FIG. 12, the convex-concave pattern 10a includes a plurality of convexities 10av and a plurality of concavities 10ac defined by the convexities 10av. The concavities 10ac placed between convexities 10av may have bottom surfaces that are substantially parallel to the surface of the substrate. The convexities 10av may include a plurality of facets UF, LF, which are crystal planes, and one upper vertex V formed where some of the facets UF, LF meet. Specifically, the facets UF and LF may include lower facets LF which are first crystal planes, and upper facets UF which are second crystal planes. Here, the upper vertex V may be formed where the upper facets UF meeting. An inclined angle θ2 of the upper facets UF relative to the surface of the substrate may be smaller than an inclined angle θ1 of the lower facets LF relative to the surface of the substrate.

The convexities may have a stripe shape or an island shape corresponding to the shape of the etching mask pattern 13a described with reference to FIG. 8, FIG. 9, and FIG. 10. When the etching mask pattern 13a has a circular or polygonal island shape, particularly, a circular island shape, the bottom surfaces defined by the lower facets LF of the convexities 10av may have a quasi-triangular shape, each line of which is a curved line bulging outwards, as shown in FIG. 11 and FIG. 12. In addition, the upper facets UF of the convexities 10av may have a substantially hexagonal shape in top view.

Figure 7F:
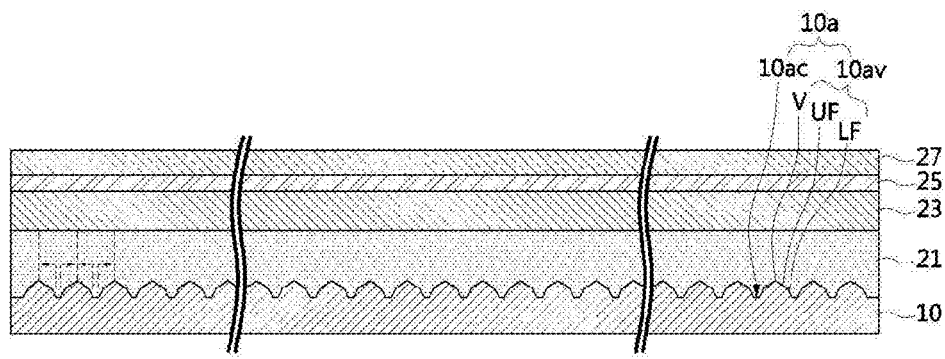

Referring to FIG. 7(f), a buffer layer 21 may be formed on the substrate having the convex-concave pattern 10a formed thereon. When the substrate 10 has a different lattice parameter than the first conductivity-type semiconductor layer described below, the buffer layer 21 relieves lattice mismatch therebetween, and may be an undoped GaN layer.

Here, an uppermost end of each of the convexities 10av is a sharp vertex V, and each of the facets UF and LF thereof may have a predetermined inclined angle relative to the surface of the substrate, whereby the buffer layers 21 can be preferentially grown in a vertical direction on the bottom surfaces of the concavities 10ac, which are parallel to the surface of the substrate. Then, the buffer layers 21 preferentially grown on the bottom surfaces of adjacent concavities 10ac meet each other beyond the convexities 10av via lateral growth. Accordingly, threading dislocation density is reduced in a region above the convexities 10av, thereby improving crystal quality. In addition, the method according to the present exemplary embodiment has a reduced number of processes, as compared with typical epitaxial lateral overgrowth (ELO) using an epitaxial mask pattern.

In addition, since all of the plural facets UF, LF of the convexities 10av are the crystal planes formed by wet etching, these facets have a crystallographically stable surface state, generation of crystal defects in the buffer layer 21, which are formed on these facets, can be suppressed.

The first conductivity-type semiconductor layer 23 may be formed on the buffer layer 21. The first conductivity-type semiconductor layer 23 is a nitride-based semiconductor layer and may be an n-type impurity doped layer. By way of example, the first conductivity-type semiconductor layer 23 may include a plurality of $In_xAl_yGa_{1-x-y}N$ ($0 \leq x \leq 1$, $0 \leq y \leq 1$, $x+y \leq 1$) layers having different compositions. Then, the active layer 25 is formed on the first conductivity-type semiconductor layer 23. The active layer 25 may be an $In_xAl_yGa_{1-x-y}N$ ($0 \leq x \leq 1$, $0 \leq y \leq 1$, $0 \leq x+y \leq 1$) layer, and may have a single quantum well structure or a multi-quantum well (MQW) structure. By way of example, the active layer 25 may have a single quantum well structure of an InGaN or AlGaN layer, or a multi-quantum well structure, which is a multilayer structure of InGaN/GaN, AlGaN/(In)GaN, or InAlGaN/(In)GaN. The second conductivity-type semiconductor layer 27 may be formed on the active layer 25. The second conductivity-type semiconductor layer 27 may also be a nitride-based semiconductor layer, and may be a p-type impurity doped layer. By way of example, the second conductivity-type semiconductor layer 27 may be formed by doping an $In_xAl_yGa_{1-x-y}N$ ($0 \le x \le 1$, $0 \le y \le 1$, $0 \le x+y \le 1$) layer with a p-type dopant such as Mg or Zn elements. Alternatively, the second conductivity-type semiconductor layer 27 may include a plurality of $In_xAl_yGa_{1-x-y}N$ ($0 \le x \le 1$, $0 \le y \le 1$, $0 \le x+y \le 1$) layers having different compositions.

The buffer layer 21, the first conductivity-type semiconductor layer 23, the active layer 25, and the second conductivity-type semiconductor layer 27 may form a stack, and may be formed by various deposition or growth processes including metal organic chemical vapor deposition (MOCVD), chemical vapor deposition (CVD), plasma-enhanced chemical vapor deposition (PECVD), molecular beam epitaxy (MBE), hydride vapor phase epitaxy (HYPE), and the like.

Figure 7G:
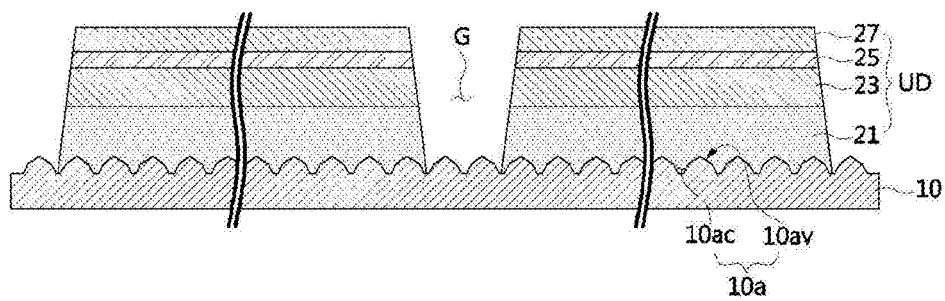

Referring to FIG. 7(g), an isolation groove G is formed to isolate the plurality of light emitting units UD from each other by etching some region of the stack until the substrate 10 is exposed therethrough. Formation of the isolation groove G may be achieved by dry etching, for example, plasma etching. When an etching gas used in dry etching has good etching selectivity, the convex-concave pattern 10a exposed in the isolation groove G may remain instead of being etched. By the isolation groove G, the semiconductor stack is divided into regions for the parallelogram-shaped light emitting units 100 and a region for the triangular light emitting unit 200, as described with reference to FIG. 1 to FIG. 3, or into regions for the triangular light emitting units 100 having three acute angles and regions for the light emitting units 200 as described with reference to FIG. 4 and FIG. 5.

Figure 7H:
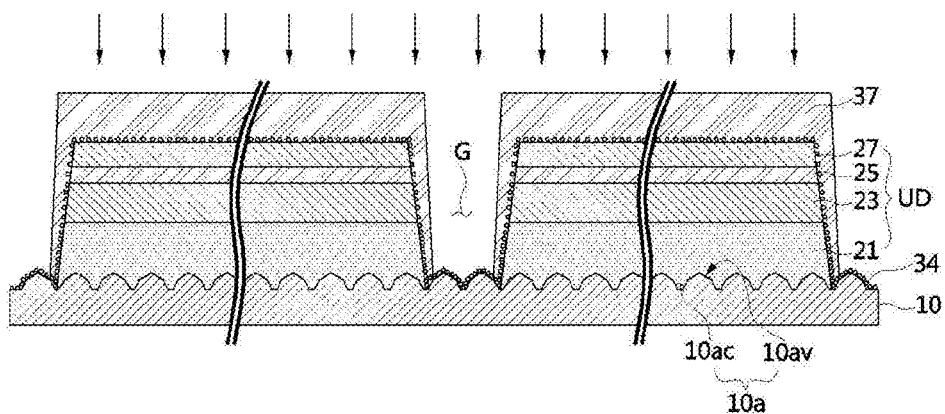

Referring to FIG. 7(h), a metal layer (not shown) is stacked on the convex-concave pattern 10a and the side and upper surfaces of the light emitting units UD exposed in the isolation groove G, and the substrate having the metal layer stacked thereon is then subjected to heat treatment to form metal clusters 34. The metal layer may have a thickness of several nanometers to dozens of nanometers, for example, a thickness from about 3 nm to about 20 nm, specifically a thickness of about 10 nm. Further, the metal layer and the metal clusters are formed of Ni, Al, or Pt. Before the metal layer is formed, a protective layer (not shown) may be optionally formed on the side and upper surfaces of the light emitting units UD. The protective layer may be a silicon oxide layer or a silicon nitride layer and prevents the metal layer or the metal clusters from reacting with the side or upper surfaces of the light emitting units UD.

A photoresist pattern 37 may be formed on the metal clusters 34 to cover the side and upper surfaces of the light emitting units UD. The surfaces of the convex-concave patterns 10a within the isolation groove G may be etched using the photoresist pattern 37 and the metal clusters 34 as a mask. As a result, fine convexities and concavities P (see FIG. 7(i)) may be formed on the surfaces of the convex-concave patterns 10a within the isolation groove G, specifically, on the surfaces of the convexities 10av and the concavities Mac. Etching of the surfaces of the convex-concave patterns 10a within the isolation groove G may be carried out by plasma etching. Here, the photoresist pattern 37 can prevent damage to the light emitting units UD by plasma.

Figure 7I:
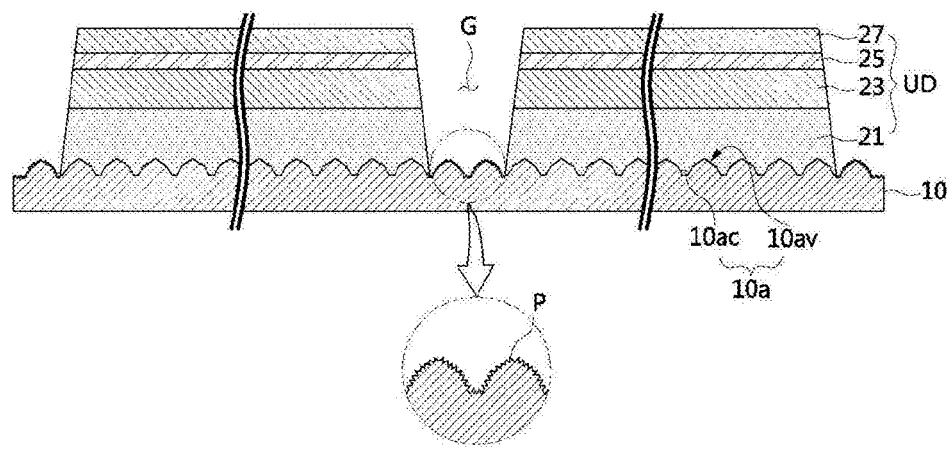

Referring to FIG. 7(i), the photoresist pattern 37 and the metal clusters 34 may be removed. As a result, the convex-concave patterns 10a having the fine convexities and concavities P on the surfaces thereof within the isolation groove G may be exposed.

Figure 7J:
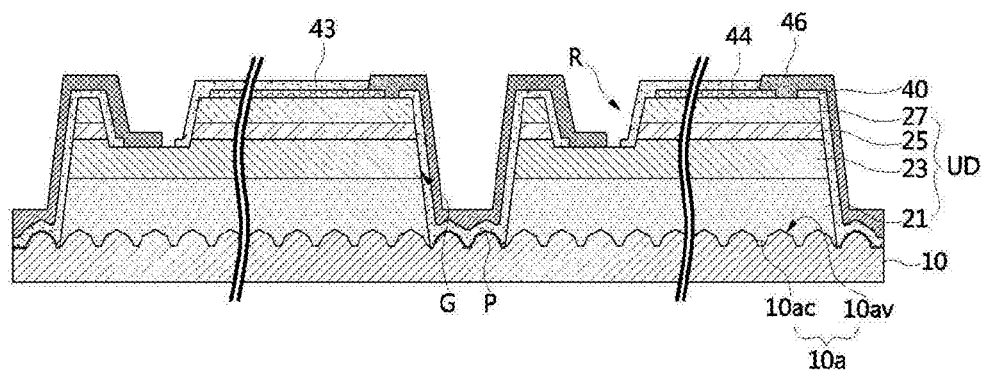

Referring to FIG. 7(j), a mesa-etched region R may be formed on the upper surface of each of the light emitting units UD to expose the first conductivity-type semiconductor layer 23 therethrough by etching the second conductivity-type semiconductor layer 27 and the active layer 25. On a side surface of the mesa-etched region R, the second conductivity-type semiconductor layer 27 and the active layer 25 of each of the light emitting units UD may be exposed. The mesa-etched region R may have a width that gradually decreases as the mesa-etched region approaches the substrate 10.

As shown in FIG. 7(j), the mesa-etched region R may be separated a predetermined distance from the isolation groove G. That is, the mesa-etched region R may be formed in a groove shape penetrating through the second conductivity-type semiconductor layer 27 and the active layer 25. Alternatively, the mesa-etched region R may be formed directly adjacent to the isolation groove G.

A current spreading conductive layer, for example, a transparent electrode layer 44, may be formed on the second conductivity-type semiconductor layer 27 of each of the light emitting units UD. The current spreading conductive layer 44 may be a light transmitting conductive layer. For example, the current spreading conductive layer 44 may be formed of indium tin oxide (ITO), Ni/Au, or Cu/Au.

Then, after an insulating layer is formed on the overall surface of the substrate, the insulating layer is subjected to patterning to form an isolation layer 40, which covers the convex-concave patterns 10a and the side surfaces of the light emitting units UD exposed in the isolation groove G, and the passivation layer 43 disposed on the current spreading conductive layer 44. The isolation layer 40 may extend to one sidewall within the mesa-etched region R adjacent the isolation groove G. The passivation layer 43 may extend to the other sidewall within the mesa-etched region R and may expose a portion of the current spreading conductive layer 44 therethrough. The isolation layer 40 and the passivation layer 43 may be formed of a polyimide layer, a silicon oxide layer, or a silicon nitride layer.

Interconnection wires 46 may be formed on the isolation layer 40 to electrically connect a pair of light emitting units UD adjacent the isolation layer 40. The interconnection wire 46 may be electrically connected to the second conductivity-type semiconductor layer 27 (or current spreading layer 44) of one side of the pair of light emitting units UD, that is, a first light emitting unit, and to the first conductivity-type semiconductor layer 23 of the other side of the pair of light emitting units UD, that is, a second light emitting unit. In this case, the light emitting units UD may be connected to each other in series by the interconnection wires 46, thereby allowing high operating voltage. Particularly, first electrodes 100a, 200a (see FIG. 1) and second electrodes 100b, 200b are formed on the light emitting units UD and connected to each other by the interconnection wires 46. The first and second electrodes and the interconnection wires may be formed of the same material by the same process. In addition, a first electrode pad 300a (see FIG. 1 and FIG. 4) and a second electrode pad 300b (see FIG. 1 and FIG. 4) may also be formed together with the interconnection wires 46.

The isolation layer 40 may be placed between the interconnection wire 46 and the second conductivity-type semiconductor layer 27 of the second light emitting unit. The mesa-etched region R may have a width that gradually decreases as the mesa-etched region approaches the substrate, thereby preventing disconnection of the interconnection wire 46.

Figure 13A:
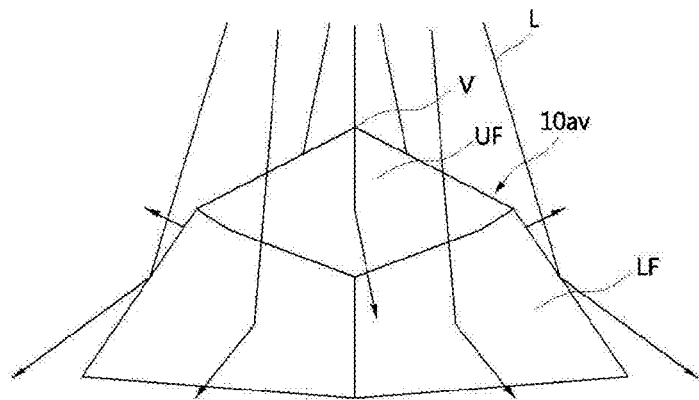
FIG. 13(a) and FIG. 13(b) are diagrams illustrating reflection of light emitted from an active layer in various directions by a convex-concave pattern formed at a lower portion of a light emitting diode and a convex-concave pattern within an isolation region, respectively.
Figure 13B:
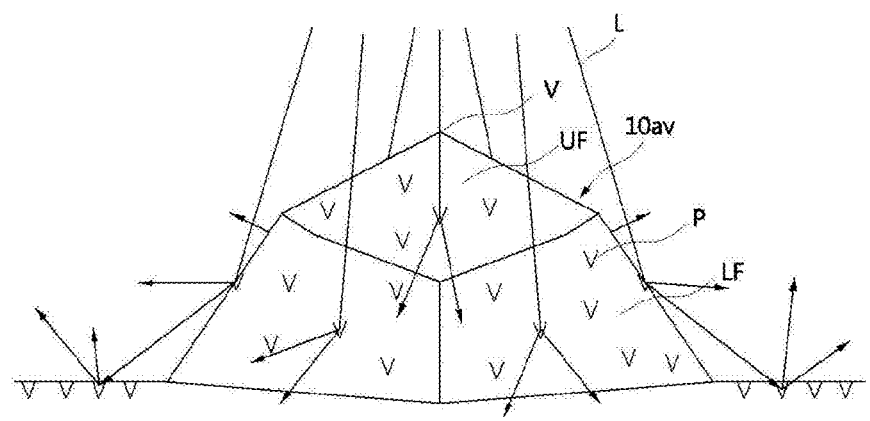

FIG. 13(a) and FIG. 13(b) are diagrams illustrating reflection of light emitted from an active layer in various directions by a convex-concave pattern formed at a lower portion of a light emitting diode and a convex-concave pattern within an isolation region.

Referring to FIG. 13(a), in operation of the light emitting diode described with reference to FIG. 7(j), light travelling from the active layer 25 (see FIG. 7(j)) towards the substrate 10 (see FIG. 7(j)) under the active layer will meet the convexities 10av. Here, since each of the convexities 10av has a sharp vertex V and the facets UF, LF having inclined angles relative to the surface of the substrate, the light emitted from the active layer 25 (see FIG. 7(j)) can be reflected in various directions. As a result, the light emitting diode may have improved light extraction efficiency.

Referring to FIG. 13(b), light traveling from the active layer 25 (see FIG. 7(j)) towards the substrate within the isolation groove G will meet the convexities 10av and the concavities Mac therebetween. Here, as described with reference to FIG. 13(a), the light can be reflected in various directions by the shapes of the convexities 10av, that is, the facets UF, LF having the inclined angles and the sharp vertices. In addition, the light can undergo diffuse reflection not only by the surfaces of the convexities 10av but also by the fine convexities and concavities P formed on the surfaces of the concavities Mac. As a result, the light emitting diode may have further improved light extraction efficiency. In addition, some of the light entering the substrate 10 can be easily extracted through the convex-concave pattern 10a having the fine convexities and concavities P.

FIG. 14(a), FIG. 14(b), FIG. 14(c), FIG. 14(d), and FIG. 14(e) are sectional views illustrating a method of fabricating a light emitting diode according to an exemplary embodiment of the present invention. The method of fabricating a light emitting diode according to the present exemplary embodiment is similar to the fabrication method described with reference to FIG. 7(a) to FIG. 7(j) except for the following features.

Figure 14A:
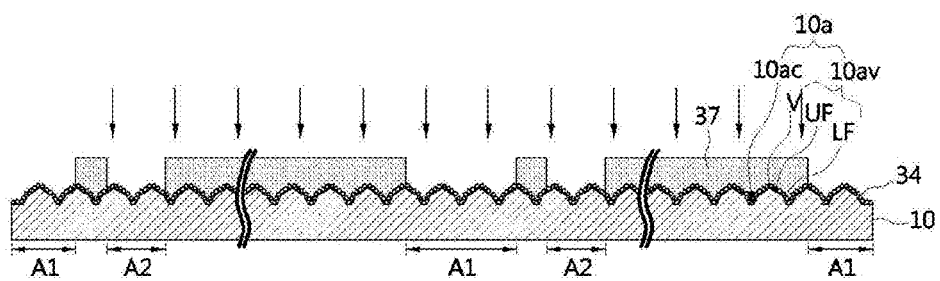
FIG. 14(a), FIG. 14(b), FIG. 14(c), FIG. 14(d), and FIG. 14(e) are sectional views illustrating a method of fabricating a light emitting diode according to an exemplary embodiment of the present invention.

Referring to FIG. 14(a), convex-concave patterns 10a are formed on an upper surface of a substrate 10. The convex-concave patterns 10a may be formed by the same method as in FIG. 7(a) to FIG. 7(e).

After a metal layer (not shown) is stacked on the convex-concave patterns 10a, the substrate having the metal layer stacked thereon is subjected to heat treatment to form metal clusters 34. A photoresist pattern 37 is formed on the metal clusters 34. The photoresist pattern 37 exposes some regions, specifically, a first area A1 and a second area A2. The first area A1 may correspond to an isolation groove described below, and the second area A2 may correspond to the mesa-etched region. Alternatively, the photoresist pattern 37 may expose only the first area A1 corresponding to the isolation groove described below.

Then, the surfaces of the convex-concave patterns 10a in the first area A1 and the second area A1 are etched using the photoresist pattern 37 and the metal clusters 34 as a mask. As a result, fine convexities and concavities P (see FIG. 14(b)) are formed on the surfaces of the convex-concave patterns 10a in the first area A1 and the second area A2, specifically, on the surfaces of the convexities 10av and the concavities Mac.

Figure 14B:
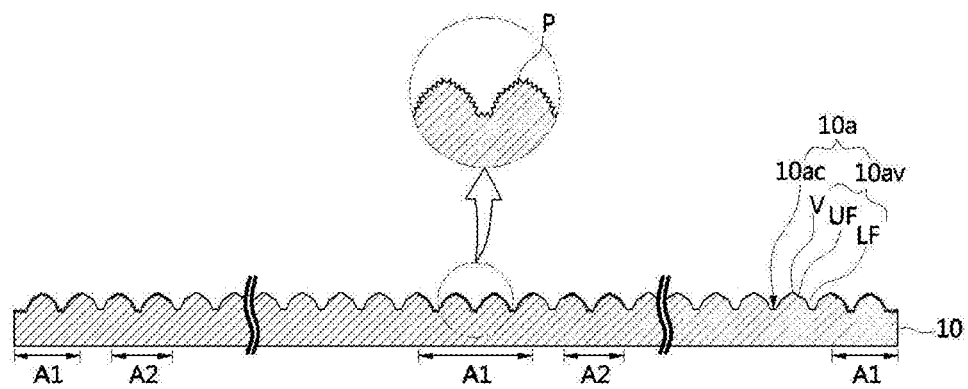

Referring to FIG. 14(b), the photoresist pattern 37 and the metal clusters 34 are removed. As a result, the convex-concave patterns 10a having the fine convexities and concavities P within the first area A1 and the second area A2 are exposed.

Figure 14C:
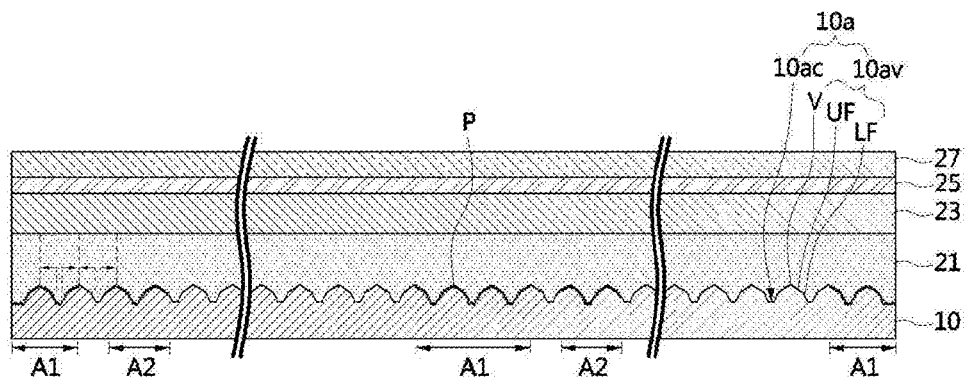

Referring to FIG. 14(c), a buffer layer 21 is formed on the substrate, on which the convex-concave patterns 10a having the fine convexities and concavities P on the surfaces thereof are formed. As a result, as described with reference to FIG. 7(f), in a region excluding the first area A1 and the second area A2, threading dislocation density may be reduced due to the shapes of the convex-concave patterns 10a and crystallographically stable face, thereby improving crystal quality. In the first area A1 and the second area A2, threading dislocation may be generated due to the fine convexities and concavities P formed on the surfaces of the convex-concave patterns 10a.

Then, a first conductivity-type semiconductor layer 23, an active layer 25, and a second conductivity-type semiconductor layer 27 are formed on the buffer layer 21 to form a semiconductor stack.

Figure 14D:
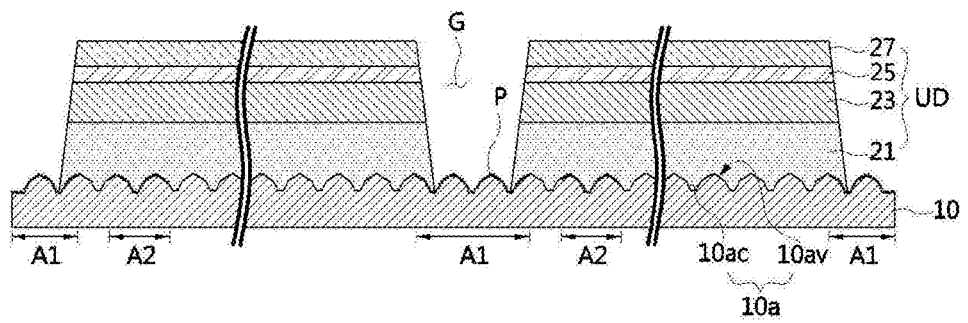

Referring to FIG. 14(d), an isolation groove G is formed to isolate the light emitting units UD from each other by etching a region on the first area A1 of the stack until the substrate 10 is exposed. The convex-concave patterns 10a having the surface fine convexities and concavities exposed to the isolation groove G is exposed. In addition, by the isolation groove G, the semiconductor stack is divided into regions for the parallelogram-shaped light emitting units 100 and a region for the triangular light emitting unit 200, as described with reference to FIG. 1 to FIG. 3, or into regions for the triangular light emitting units 100 having three acute angles and a region for the triangular and pentagonal light emitting units 200 as described with reference to FIG. 4 and FIG. 5.

Figure 14E:
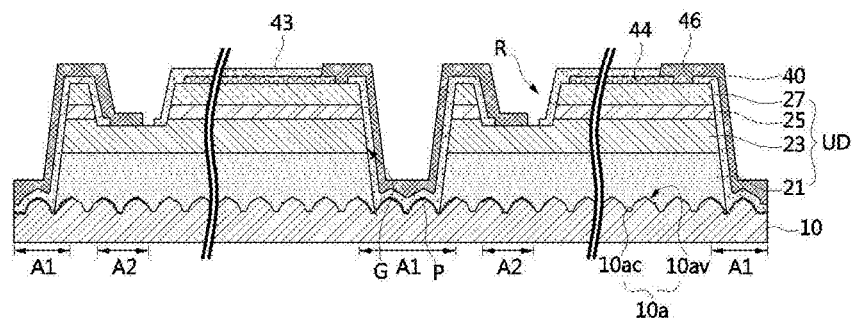

Referring to FIG. 14(e), a mesa-etched region R may be formed on an upper surface of each of the light emitting units UD to expose the first conductivity-type semiconductor layer 13 therethrough by etching the second conductivity-type semiconductor layer 27 and the active layer 25. The mesa-etched region R corresponds to the second area A2. The mesa-etched region R may be separated a predetermined distance from the isolation groove G. Alternatively, the mesa-etched region R may be placed adjacent the isolation groove G. Then, as described with reference to FIG. 7(j), a current spreading conductive layer 44, an isolation layer 40, a passivation layer 43, and an interconnection wire 46 are formed. The interconnection wire 46 is formed together with the first electrodes 100a, 200b, the second electrodes 100b, 200b and electrode pads 300a, 300b.

In operation of such a light emitting diode, light travelling from the active layer 25 towards the substrate 10 under the active layer will meet the convexities 10av. Here, since each of the convexities 10av has a sharp vertex V and the facets UF, LF having inclined angles relative to the surface of the substrate, the light emitted from the active layer 25 can be reflected in various directions. As a result, the light emitting diode may have improved light extraction efficiency. In addition, light traveling from the active layer 25 towards the substrate within the isolation groove G will meet the convexities 10av and the concavities 10ac therebetween. Here, as described above, not only can the light be reflected in various directions by the shapes of the convexities 10av, but also can undergo diffuse reflection by the surfaces of the convexities 10av and the fine convexities and concavities P formed on the surfaces of the concavities Mac. As a result, the light emitting diode may have further improved light extraction efficiency by the fine convexities and concavities P.

On the other hand, threading dislocations, which are generated in the first area A1 due to the surface fine convexities and concavities P of the convex-concave pattern 10a when forming the stack, can be completely removed in the course of forming the isolation groove G. In addition, when forming the stack, threading dislocations can be generated in the second area A2 due to the surface fine convexities and concavities P of the convex-concave pattern 10a and propagate into the active layer 25 within this area. However, since the active layer 25 within this area is removed in formation of the mesa-etched region R, deterioration in crystal quality of the active layer 25 due to such threading dislocations will not occur. Thus, the fine convexities and concavities P formed on the surfaces of the convex-concave patterns 10a may improve light extraction efficiency without significantly deteriorating epitaxial quality in a final device.

Figure 15A:
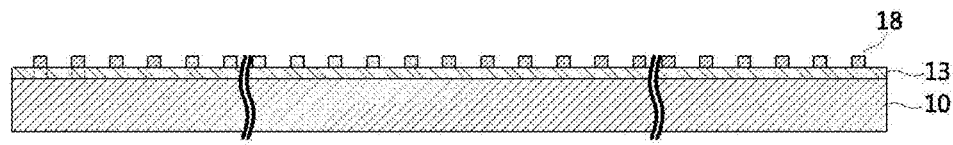
FIG. 15(a), FIG. 15(b), and FIG. 15(c) are sectional views illustrating a method of fabricating a light emitting diode according to an exemplary embodiment of the present invention.
Figure 15B:
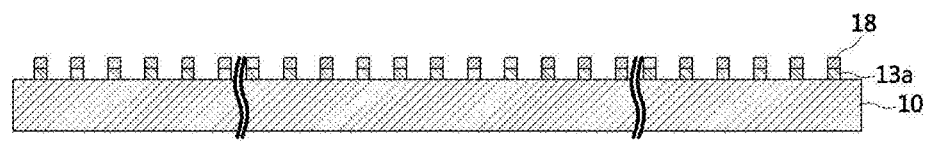
Figure 15C:
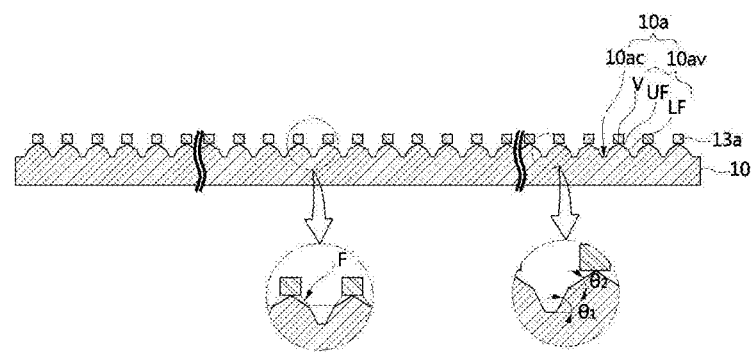

FIG. 15(a), FIG. 15(b), and FIG. 15(c) are sectional views illustrating a method of fabricating a light emitting diode according to an exemplary embodiment of the present invention. The method of fabricating a light emitting diode according to the present exemplary embodiment may be similar to the fabrication method described with reference to FIG. 7(a) to FIG. 7(j) except for the following features.

Referring to FIG. 15(a), a substrate 10 is prepared. An etching mask layer 13 is formed on an upper surface of the substrate 10. A photoresist pattern 18 is formed on the etching mask layer 13.

Referring to FIG. 15b, the etching mask layer 13 may be subjected to wet or dry etching using the photoresist pattern 18 as a mask. As a result, an etching mask pattern 13a is formed. The etching mask pattern 13a may be formed to a width ranging from 0.2 μm to 1 μm. To this end, the width of the photoresist pattern 18 may be adjusted. The etching mask pattern 13a may have various shapes. For example, the etching mask pattern 13a may have a stripe shape (FIG. 8), a circular island shape (FIG. 9), or a polygonal island shape (FIG. 10), as shown in FIG. 8 to FIG. 10.

Referring to FIG. 15(c), the etching mask pattern 13a may be exposed by removing the photoresist pattern 18. With the etching mask pattern 13a as a mask, the substrate 10 may be subjected to etching to form a convex-concave pattern 10a including concavities Mac and convexities 10av on the upper surface of the substrate 10. The substrate 10 may be etched by wet etching.

The convexities 10av may have lower facets LF, which are first crystal planes, and upper facets UF, which are second crystal planes different than the first crystal plane, in which the second crystal planes meet to form an upper vertex V. In addition, the bottom surfaces of the concavities Mac placed between the convexities 10av may be substantially parallel to the surface of the substrate.

Etching may be wet etching. An etching solution used in the etching process may exhibit a significantly different etching rate dependent upon a crystal direction of the substrate 10. In other words, the etching solution may preferentially etch the substrate 10 in a specific crystal direction. By way of example, when the substrate 10 is a sapphire substrate or a GaN substrate, the etching solution may be a mixture of sulfuric acid and phosphoric acid, a mixture of nitric acid and phosphoric acid, or a KOH solution. When the substrate 10 is a SiC substrate, the etching solution may be a BOE (buffered oxide etchant) or HF solution, and when the substrate 10 is a Si substrate, the etching solution may be a KOH solution. By way of example, when the substrate 10 is a c-plane sapphire substrate and the etching solution is a mixture solution of sulfuric acid and phosphoric acid in a volume ratio of 3:1, the c-plane may be preferentially etched in the course of wet etching.

During such a wet etching process, the substrate 10 exposed through the etching mask patterns 13a is etched such that the first crystal planes (dotted line F) inclined at a first angle (θ1) relative to the surface of the substrate may be exposed. Then, the substrate 10 is further etched such that the first crystal planes extend in a lower direction of the substrate 10 to form the lower facets LF of the convexities 10av. On the other hand, the first crystal planes (dotted line F) formed in an initial stage of etching and placed near the surface of the substrate 10 are also gradually etched to expose other crystal planes, that is, second crystal planes inclined at a first angle θ2 relative to the surface of the substrate, which can constitute upper facets UF. The second crystal planes meet to form an upper vertex V.

In this way, the etching mask pattern 13a is formed to have a small width, for example, a width of 0.2 μm to 1 μm, whereby the etching solution can sufficiently infiltrate a lower portion of the etching mask pattern 13a, with the etching mask pattern 13a remaining, thereby forming the upper facets UF and the upper vertex V.

Next, the process is performed in the manner as described with reference to FIG. 7(f) and FIG. 7(j), thereby preparing a light emitting diode as shown in FIG. 7(j).

FIG. 16(a), FIG. 16(b), FIG. 16(c), and FIG. 16(d) are sectional views illustrating a method of fabricating a light emitting diode according to an exemplary embodiment of the present invention. The method of fabricating a light emitting diode according to the present exemplary embodiment may be similar to the fabrication method described with reference to FIG. 7(a) to FIG. 7(j) except for the following features.

Figure 16A:
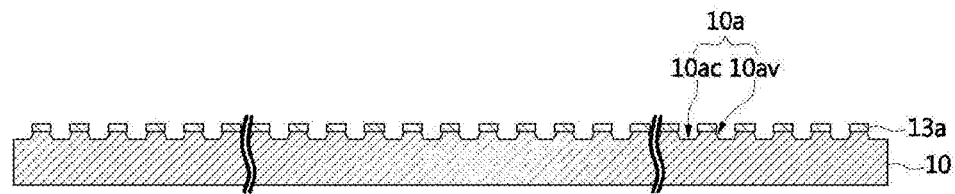
FIG. 16(a), FIG. 16(b), FIG. 16(c), and FIG. 16(d) are sectional views illustrating a method of fabricating a light emitting diode according to an exemplary embodiment of the present invention.

Referring to FIG. 16(a), an etching mask pattern 13a is formed on a substrate 10. The etching mask pattern 13a may be formed by a process similar to the process described with reference to FIG. 7a and FIG. 7b. The etching mask pattern 13a may be formed using a silicon oxide layer, a silicon nitride layer, or a silicon nitride oxide layer. However, the etching mask layer 13 may be formed of any material having etching selectivity with respect to the substrate 10. The etching mask pattern 13a may be formed in various shapes. For example, the etching mask pattern 13a may have a stripe shape (FIG. 8), a circular island shape (FIG. 9), or a polygonal island shape (FIG. 10), as shown in FIG. 8 to FIG. 10. When unit patterns of the etching mask pattern 13a have an island shape, the unit patterns of the etching mask pattern 13a may be disposed such that six unit patterns surround a single unit pattern in a hexagonal arrangement.

With the etching mask pattern 13a as a mask, the substrate 10 may be subjected to etching to form a convex-concave pattern 10a including concavities Mac and convexities 10av on an upper surface of the substrate 10. The substrate 10 may be etched by wet etching.

An etching solution used for wet etching may exhibit significantly different etching rates dependent upon a crystal direction of the substrate 10. In other words, the etching solution may preferentially etch the substrate 10 in a specific crystal direction. By way of example, when the substrate 10 is a sapphire substrate or a GaN substrate, the etching solution may be a mixture of sulfuric acid and phosphoric acid, a mixture of nitric acid and phosphoric acid, or a KOH solution. When the substrate 10 is a SiC substrate, the etching solution may be a BOE (buffered oxide etchant) or HF solution, and when the substrate 10 is a Si substrate, the etching solution may be a KOH solution. By way of example, when the substrate 10 is a c-plane sapphire substrate and the etching solution is a mixture solution of sulfuric acid and phosphoric acid in a volume ratio of 3:1, the c-plane may be preferentially etched in the course of wet etching.

Figure 16B:
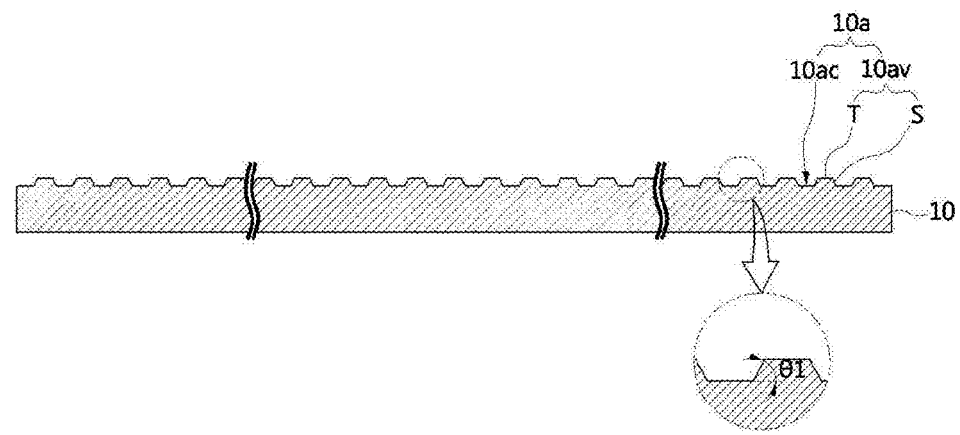

Referring to FIG. 16(b), the upper surfaces of the convexities 10av are exposed by removing the etching mask pattern 13a. The upper surfaces T of the convexities 10av may be planar surfaces, and facets S thereof may have a first inclined angle θ1 relative to the surface of the substrate. Such facets may be first crystal planes. In addition, the angles of the facets S of the convexities 10av inclined relative to the surface of the substrate, that is, sloped angles of the facets of the convexities 10av, may be identical or may be different dependent upon the facets S thereof. Further, bottom surfaces of the concavities Mac placed between the convexities 10av may be coplanar with the surface of the substrate.

Figure 17:
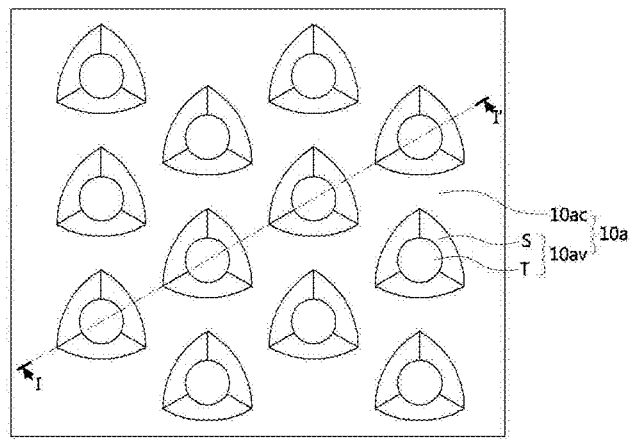
FIG. 17 is a plan view of a convex-concave pattern according to an exemplary embodiment of the present invention.

With reference to FIG. 17, the convex-concave pattern will be described in more detail. FIG. 16(b) is a cross-sectional view taken along line I-I' of FIG. 17.

Referring to FIG. 16(b) and FIG. 17, the convex-concave pattern 10a includes a plurality of convexities 10av and a plurality of concavities Mac defined by the convexities 10av. The bottom surfaces of the concavities Mac placed between convexities 10av and the upper surfaces of the convexities 10av may be planes that are substantially parallel to the surface of the substrate, for example, c-planes. Although the convexities may have a stripe shape or an island shape corresponding to the shape of the etching mask pattern 13a described with reference to FIG. 8 to FIG. 10, the etching mask pattern 13a may also have a circular or polygonal island shape. In this case, particularly, when the etching mask pattern 13a has a circular island shape, the bottom surfaces of the convexities 10av defined by side surfaces thereof may have a quasi-triangular shape, each side of which bulges outwards, as shown in FIG. 17. Further, the upper surfaces of the convexities 10av may have a circular shape corresponding to the shape of the etching mask pattern 13a.

Figure 16C:
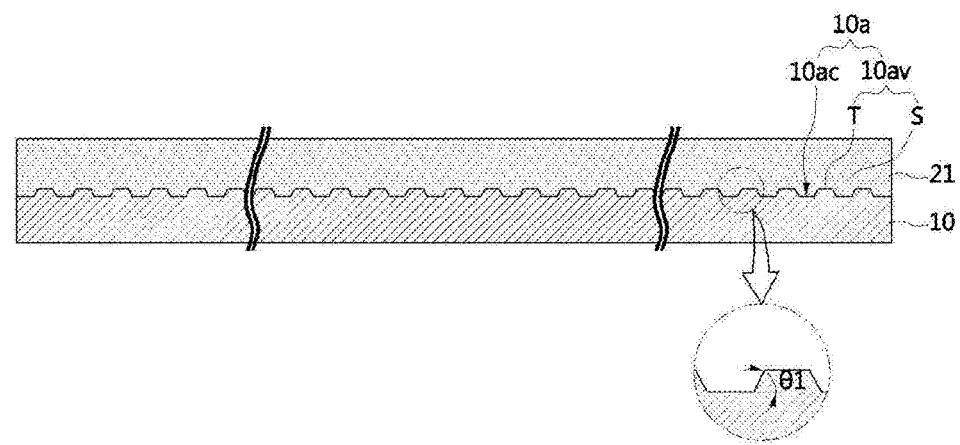

Referring to FIG. 16(c), a buffer layer 21 may be formed on the substrate having the convex-concave pattern 10a formed thereon. Here, the buffer layer 21 may be preferentially grown in a vertical direction on the bottom surfaces of the concavities Mac and the upper surfaces of the convexities 10av, which are parallel to the surface of the substrate. Further, since the bottom surfaces of the concavities Mac and the facets S of the convexities 10av are stable crystal planes formed by wet etching, there is a low possibility that dislocations will be formed thereon. Accordingly, the light emitting diode may have improved crystal quality.

Figure 16D:
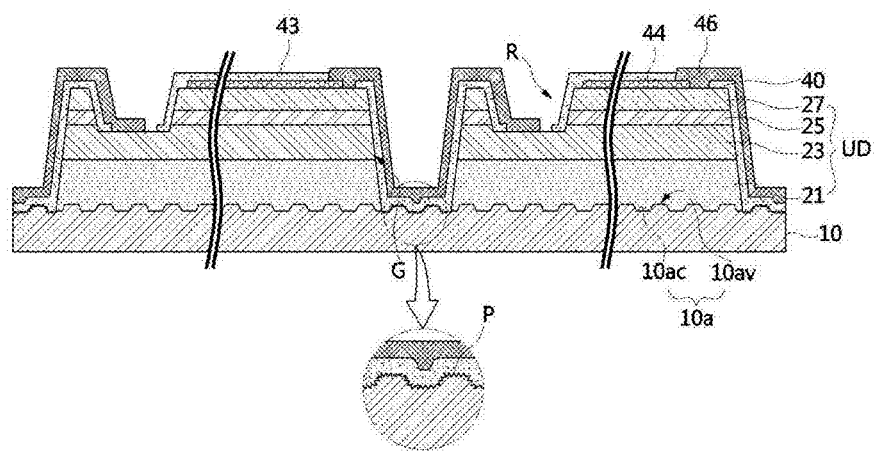

Next, the process is performed in the manner as described with reference to FIG. 7(f) and FIG. 7(j), thereby preparing a light emitting diode as shown in FIG. 16(d).

FIG. 18(a), FIG. 18(b), FIG. 18(c), and FIG. 18(d) are sectional views illustrating a method of fabricating a light emitting diode according to an exemplary embodiment of the present invention. The method of fabricating a light emitting diode according to the present exemplary embodiment may be similar to the fabrication method described with reference to FIG. 7(a) to FIG. 7(j) except for the following features.

Figure 18A:
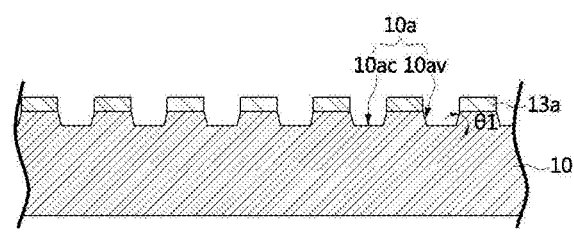
FIG. 18(a), FIG. 18(b), FIG. 18(c), and FIG. 18(d) are sectional views illustrating a method of fabricating a light emitting diode according to an exemplary embodiment of the present invention.

Referring to FIG. 18(a), an etching mask pattern 13a is formed on a substrate 10. The etching mask pattern 13a may be formed by a process similar to the process described with reference to FIG. 7(a) and FIG. 7(b).

With the etching mask pattern 13a as a mask, the substrate 10 is subjected to etching to form a convex-concave pattern 10a including concavities Mac and convexities 10av on an upper surface of the substrate 10. The substrate 10 may be etched by wet etching.

An etching solution used for wet etching may exhibit significantly different etching rates dependent upon a crystal direction of the substrate 10. In other words, the etching solution may preferentially etch the substrate 10 in a specific crystal direction. By way of example, when the substrate 10 is a sapphire substrate or a GaN substrate, the etching solution may be a mixture of sulfuric acid and phosphoric acid, a mixture of nitric acid and phosphoric acid, or a KOH solution. When the substrate 10 is a SiC substrate, the etching solution may be a BOE (buffered oxide etchant) or HF solution, and when the substrate 10 is a Si substrate, the etching solution may be a KOH solution. By way of example, when the substrate 10 is a c-plane sapphire substrate and the etching solution is a mixture solution of sulfuric acid and phosphoric acid in a volume ratio of 3:1, the c-plane may be preferentially etched in the course of wet etching. Upper surfaces of the convexities 10av may be planar surfaces, and facets S thereof may have a first inclined angle θ1 relative to the surface of the substrate. Such facets may be first crystal planes. In addition, the angles of the facets S of the convexities 10av inclined relative to the surface of the substrate, that is, sloped angles of the facets of the convexities 10av, may be identical or may be different dependent upon the facets S thereof. Further, the upper surfaces of the convexities 10av and the bottom surfaces of the concavities Mac placed between the convexities 10av may be substantially parallel to the surface of the substrate.

Figure 18B:
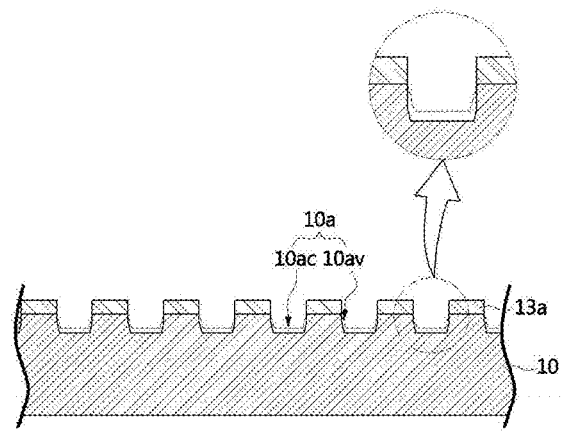

Referring to FIG. 18(b), the substrate 10 having the convex-concave pattern 10a is subjected to secondary etching using the etching mask pattern 13a as a mask. Secondary etching may be dry etching, specifically, anisotropic etching. In this process, the side surfaces of the convexities 10av and the bottom surfaces of the concavities Mac may be etched to a predetermined depth.

Figure 18C:
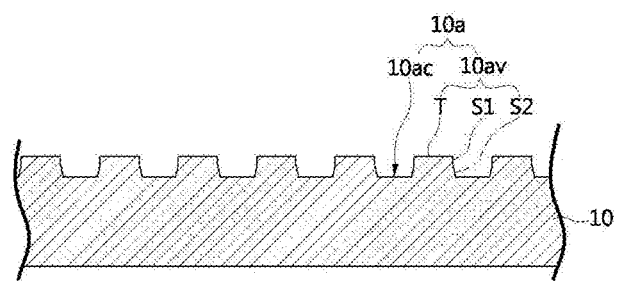

Referring to FIG. 18(c), the upper surfaces T of the convexities 10av are exposed by removing the etching mask pattern 13a. The convexities 10av have upper facets, that is, first facets S1, and lower facets, that is, second facets S2, which have different inclined angles. Specifically, the first facets S1 adjacent the upper surfaces T of the convexities 10av may be substantially perpendicular to the surface of the substrate, and the second facets S2 adjacent the concavities Mac may have a first inclined angle θ1 (FIG. 18a) relative to the surface of the substrate, or a similar inclined angle to the first inclined angle.

Figure 18D:
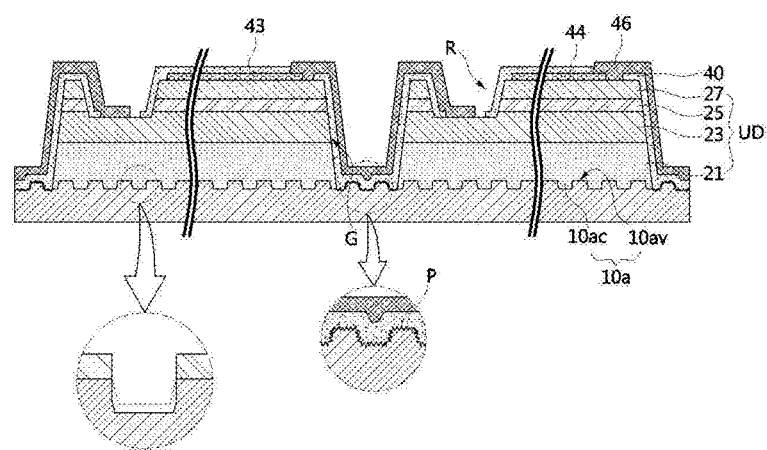

Next, the process is performed in the manner as described with reference to FIG. 7(f) and FIG. 7(j), thereby preparing a light emitting diode as shown in FIG. 18(d).

FIG. 19(a), FIG. 19(b), FIG. 19(c), and FIG. 19(d) are sectional views illustrating a method of fabricating a light emitting diode according to an exemplary embodiment of the present invention. The method of fabricating a light emitting diode according to the present exemplary embodiment may be similar to the fabrication method described with reference to FIG. 7(a) to FIG. 7(j) except for the following features.

Figure 19A:
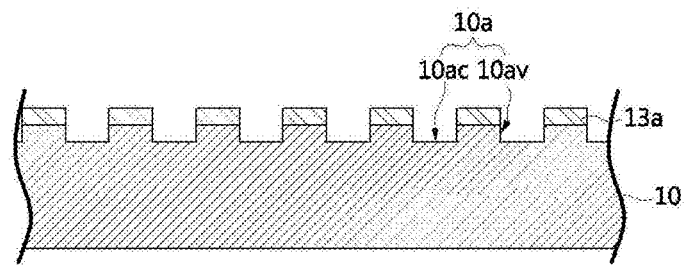
FIG. 19(a), FIG. 19(b), FIG. 19(c), and FIG. 19(d) are sectional views illustrating a method of fabricating a light emitting diode according to an exemplary embodiment of the present invention.

Referring to FIG. 19(a), an etching mask pattern 13a is formed on a substrate 10. The etching mask pattern 13a may be formed by a process similar to the process described with reference to FIG. 7(a) and FIG. 7(b).

With the etching mask pattern 13a as a mask, the substrate 10 may be subjected to etching to form a convex-concave pattern 10a including concavities Mac and convexities 10av on an upper surface of the substrate 10. The substrate 10 may be etched by dry etching, specifically, anisotropic etching. In this case, the facets of the convexities 10av may be substantially perpendicular to the surface of the substrate.

Figure 19B:
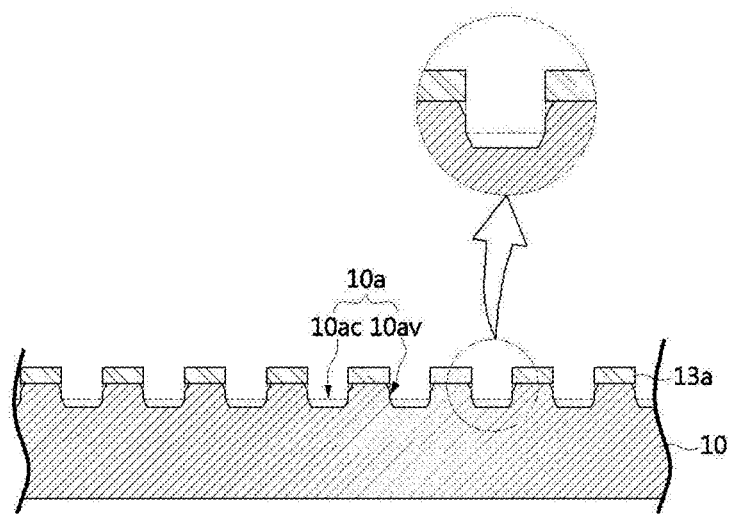

Referring to FIG. 19(b), the substrate 10 having the convex-concave pattern 10a is subjected to secondary etching using the etching mask pattern 13a as a mask. Secondary etching may be wet etching. An etching solution used for wet etching may exhibit significantly different etching rates dependent upon a crystal direction of the substrate 10. In other words, the etching solution may preferentially etch the substrate 10 in a specific crystal direction. By way of example, when the substrate 10 is a sapphire substrate or a GaN substrate, the etching solution may be a mixture of sulfuric acid and phosphoric acid, a mixture of nitric acid and phosphoric acid, or a KOH solution. When the substrate 10 is a SiC substrate, the etching solution may be a BOE (buffered oxide etchant) or HF solution, and when the substrate 10 is a Si substrate, the etching solution may be a KOH solution. By way of example, when the substrate 10 is a c-plane sapphire substrate and the etching solution is a mixture solution of sulfuric acid and phosphoric acid in a volume ratio of 3:1, the c-plane may be preferentially etched in the course of wet etching.

Figure 19C:
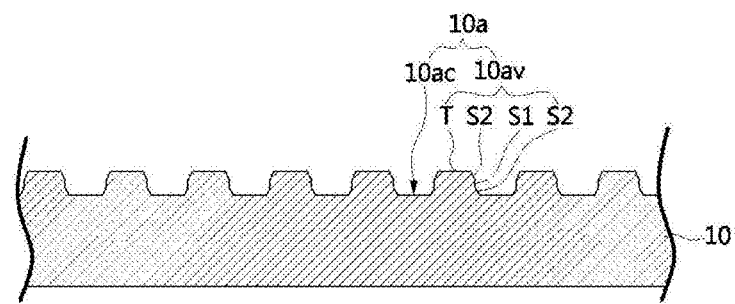

Referring to FIG. 19(c), the upper surfaces T of the convexities 10av are exposed by removing the etching mask pattern 13a. The convexities 10av have upper facets, that is, first facets S1, and lower facets, that is, second facets S2, which have different inclined angles. The second facets S2 are formed by a specific crystal plane preferentially etched in the course of wet etching and may have a predetermined inclined angle relative to the surface of the substrate. The second facets S1 may include upper facets and lower facets formed adjacent the upper surfaces T of the convexities 10av and the bottom surfaces of the concavities 10ac. In addition, middle facets placed between the second facets S2 may be substantially perpendicular to the surface of the substrate.

Figure 19D:
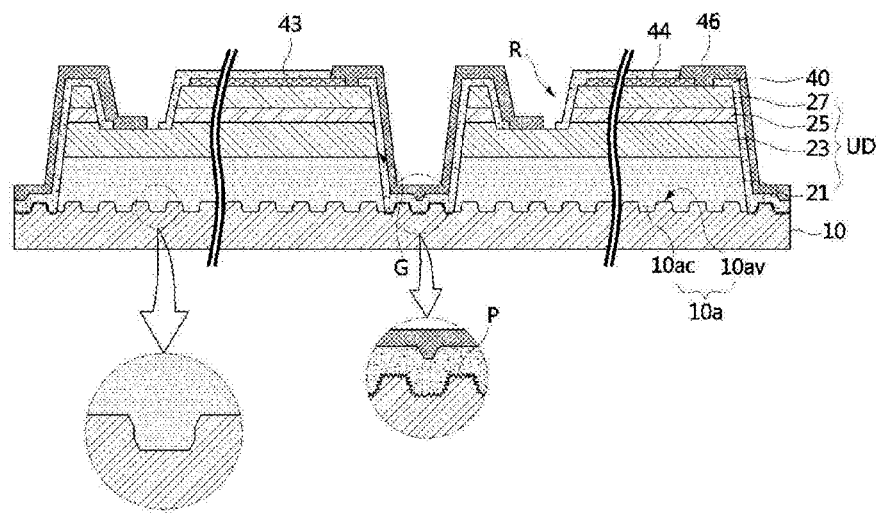

Next, the process is performed in the manner as described with reference to FIG. 7(f) and FIG. 7(j), thereby preparing a light emitting diode as shown in FIG. 19(d).

Convex-Concave Pattern Preparation Example 1

After a silicon oxide layer was formed on a c-plane sapphire substrate, a photoresist pattern was formed on the silicon oxide layer. The photoresist pattern was an array of unit patterns having a circular shape as shown in FIG. 9. The silicon oxide layer was subjected to hydrofluoric acid etching using the photoresist pattern as a mask to form a silicon oxide pattern. Next, the photoresist pattern was removed. With the silicon oxide pattern as a mask, the substrate was etched using a mixture of sulfuric acid and phosphoric acid mixed in a volume ratio of 3:1. Next, a convex-concave pattern including convexities and concavities, both of which have planar upper surfaces, was formed by removing the silicon oxide pattern.

Convex-Concave Pattern Preparation Example 2

A convex-concave pattern was formed on an upper surface of a substrate in a similar manner as in Convex-concave Pattern Preparation Example 1 except that the substrate was subjected to dry etching using a silicon oxide layer as a mask.

Convex-Concave Pattern Preparation Example 3

The substrate obtained in Convex-concave Pattern Preparation Example 1 was subjected to secondary etching using a mixture of sulfuric acid and phosphoric acid mixed in a volume ratio of 3:1.

Convex-Concave Pattern Preparation Example 4

A 10 nm thick nickel layer was formed on the convex-concave pattern as prepared in Convex-concave Pattern Preparation Example 2, followed by heat treatment to form nickel clusters on the convex-concave pattern. After the convex-concave pattern was subjected to plasma etching using the nickel clusters as a mask, the nickel clusters were removed.

Light Emitting Diode Preparation Example 1

On a substrate having the convex-concave pattern prepared in Convex-concave Pattern Preparation Example 1, an undoped GaN layer was formed by MOCVD. On the undoped GaN layer, an n-type GaN layer was formed, and an active layer having a multi-quantum well structure of InGaN/GaN was formed on the n-type GaN layer. Next, a p-type GaN layer was formed on the active layer, followed by forming a mesa-etched region through which the n-type GaN layer was exposed. Next, an ITO layer was formed on the p-type GaN layer, and an n-type electrode and a p-type electrode were formed on the n-type GaN layer exposed in the mesa-etched region and the ITO layer, respectively.

Light Emitting Diode Preparation Example 2

A light emitting diode was prepared in a similar manner as in Light Emitting Diode Preparation Example 1 except that a substrate as prepared in Convex-concave Pattern Preparation Example 2 was used.

Light Emitting Diode Preparation Example 3

A light emitting diode was prepared in a similar manner as in Light Emitting Diode Preparation Example 1 except that a substrate as prepared in Convex-concave Pattern Preparation Example 3 was used.

Figure 20:
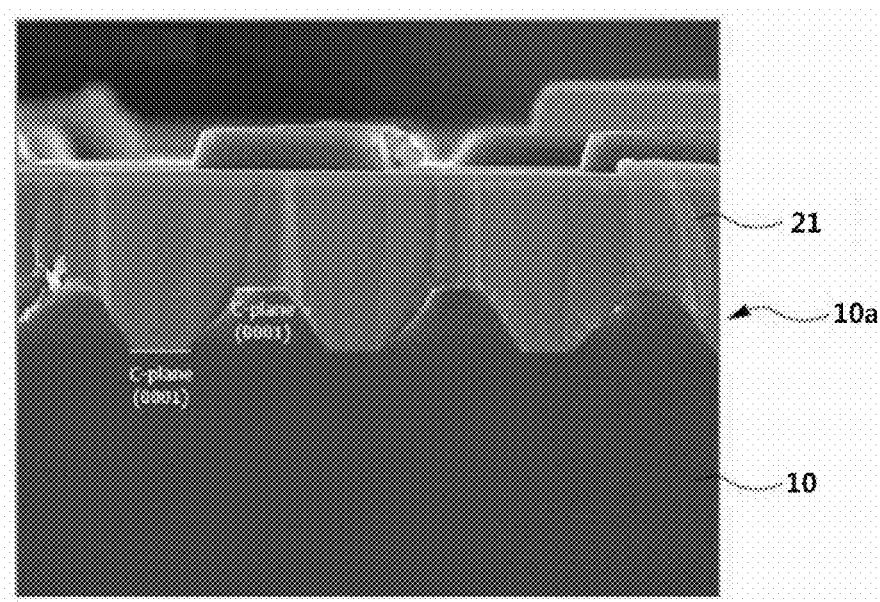
FIG. 20 and FIG. 21 are cross-sectional SEM images of convex-concave patterns after growing an epitaxial layer on the convex-concave patterns prepared in Convex-Concave Pattern Preparation Examples 1 and 2.
Figure 21:
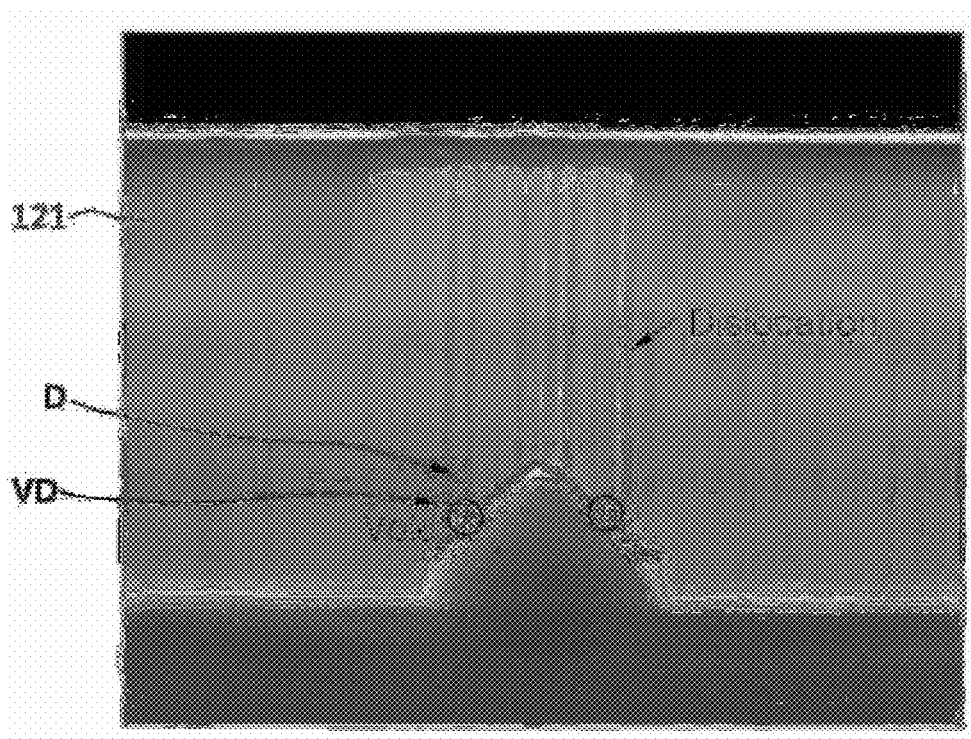

FIG. 20 and FIG. 21 are cross-sectional SEM images of convex-concave patterns after growing an epitaxial layer on the convex-concave patterns prepared in Convex-concave Pattern Preparation Examples 1 and 2.

Referring to FIG. 20 and FIG. 21, it can be seen that, when the convex-concave pattern was formed by dry etching, not only did crystallographic mismatch such as fine voids (VD) occur at an interface between inclined planes of the convex-concave pattern and an epitaxial layer 121, but also dislocation D occurred in the epitaxial layer 121 (Convex-concave Pattern Preparation Example 2, FIG. 21). On the other hand, when the convex-concave pattern 10a was formed by wet etching, neither fine voids at the interface between inclined planes of a convex-concave pattern 10a and an epitaxial layer 21 nor dislocation were observed. Thus, it can be seen that the crystal quality was good (Convex-concave Pattern Preparation Example 1, FIG. 20).

In ESD testing of the light emitting diodes prepared in Light Emitting Diode Preparation Examples 1 and 2, the light emitting diodes of Preparation Example 1 had an ESD yield of 71.07% (here, the term "ESD yield" means a ratio of light emitting diodes normally operated to a total number of light emitting diodes, when a constant voltage of 1 kV was applied three times to a plurality of light emitting diodes), whereas the light emitting diodes of Preparation Example 2 had an ESD yield of 0.33%. It is considered that this result was derived from the fact that the light emitting diode (Preparation Example 1) having the convex-concave pattern (Convex-concave Pattern Preparation Example 1) formed by wet etching had better crystal quality than the light emitting diode (Preparation Example 2) having the convex-concave pattern (Convex-concave Pattern Preparation Example 2) formed by dry etching.

Figure 22A:
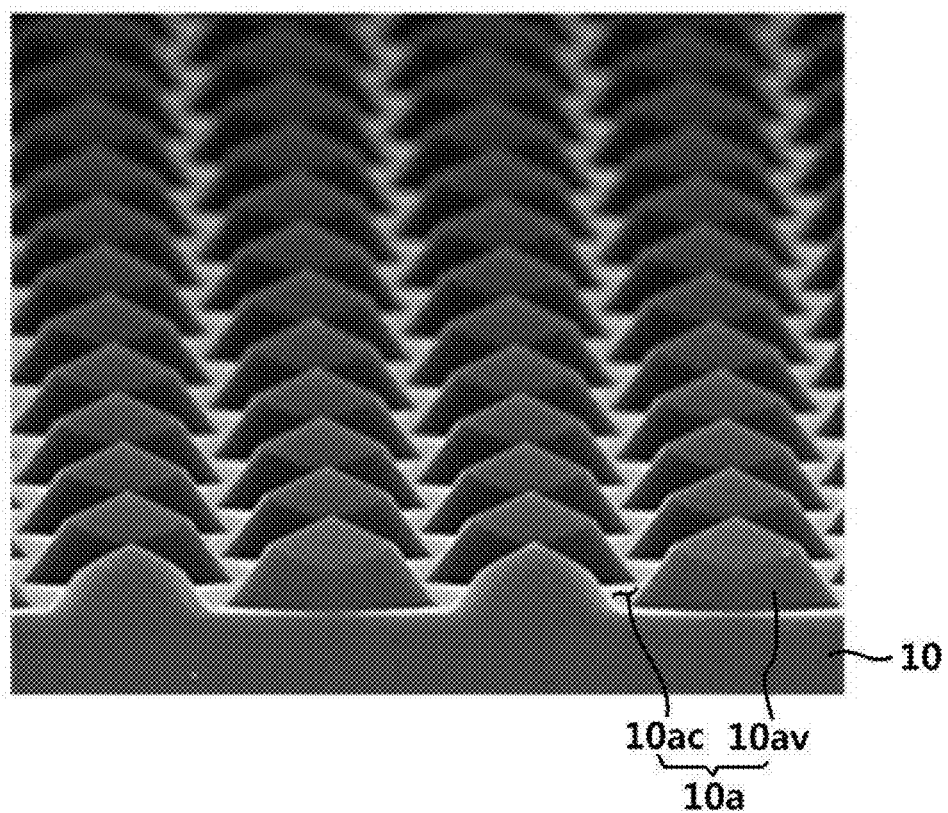
FIG. 22(a), FIG. 22(b), and FIG. 22(c) are SEM images of a substrate having a convex-concave pattern prepared in Convex-Concave Pattern Preparation Example 3.
Figure 22B:
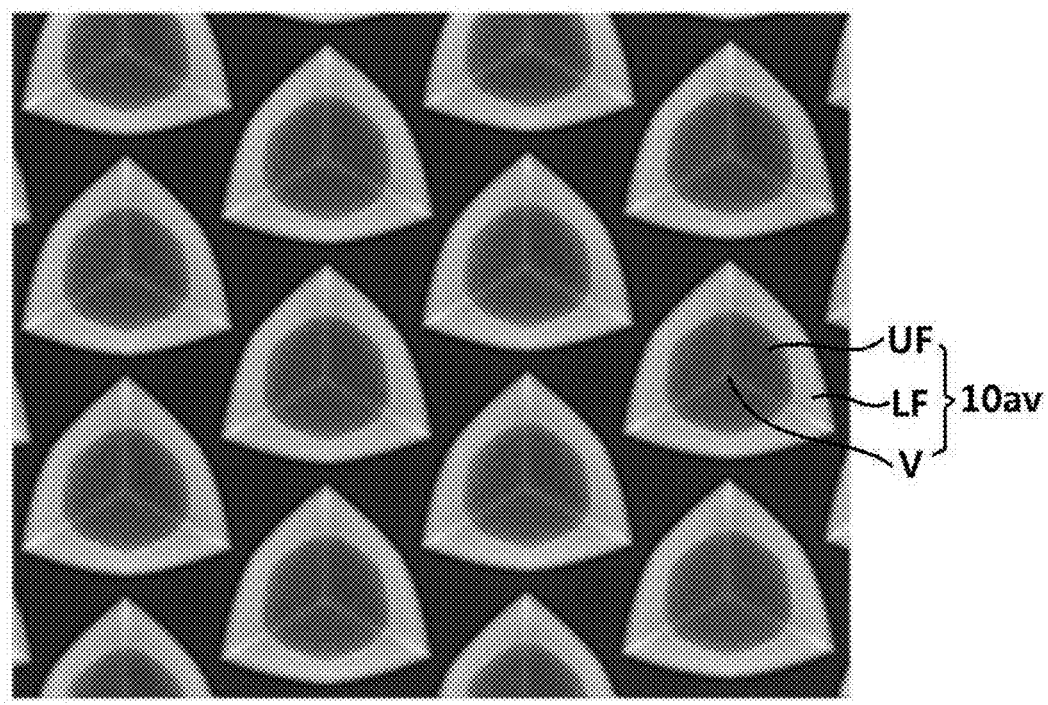
Figure 22C:
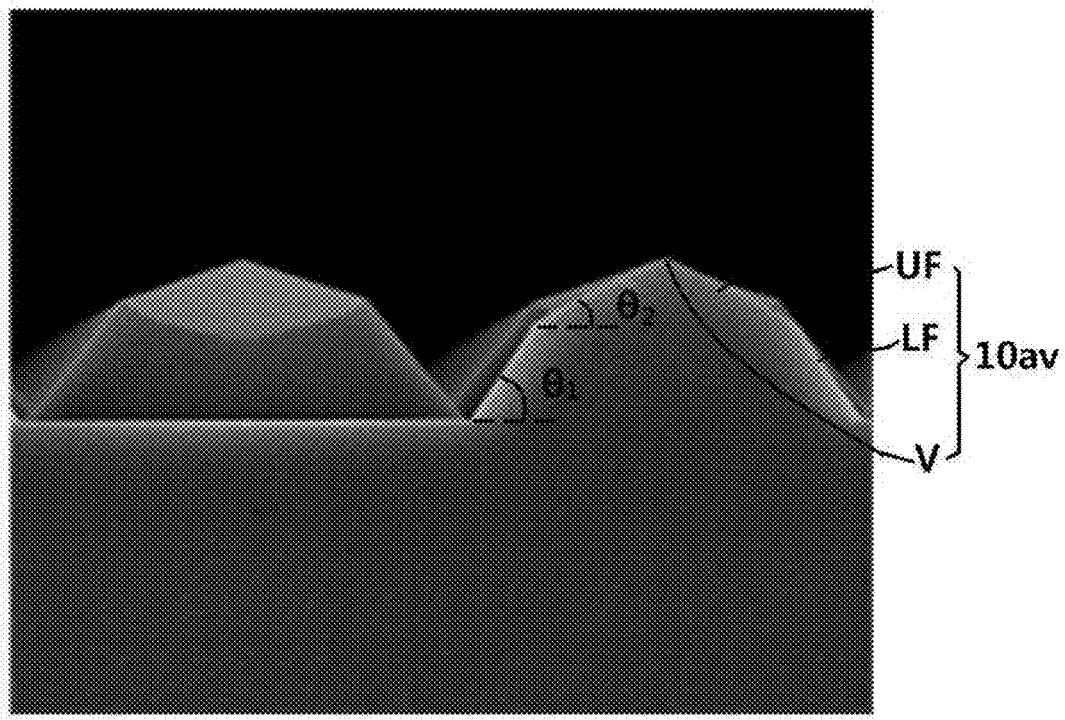

FIG. 22(a), FIG. 22(b), and FIG. 22(c) are SEM images of a substrate having a convex-concave pattern prepared in Convex-Concave Pattern Preparation Example 4.

Referring to FIG. 22(a) to FIG. 22(c), a convex-concave pattern 10a having convexities 10av and concavities 10ac defined thereby is formed on an upper surface of a substrate. Each of the convexities 10av includes lower facets LF and upper facets UF, and an upper vertex V formed where the upper facets UF meet. An angle ($\theta2$) defined between the upper facets UF and the surface of the substrate is smaller than an angle ($\theta1$) defined between the lower facets LF and the surface of the substrate.

In addition, a bottom surface defined by the lower facets LF of the convexity 10av has a quasi-triangular shape, each side of which bulges outwards. Further, the upper facets UF of the convexity 10av provide a generally hexagonal shape in top view.

Figure 23:
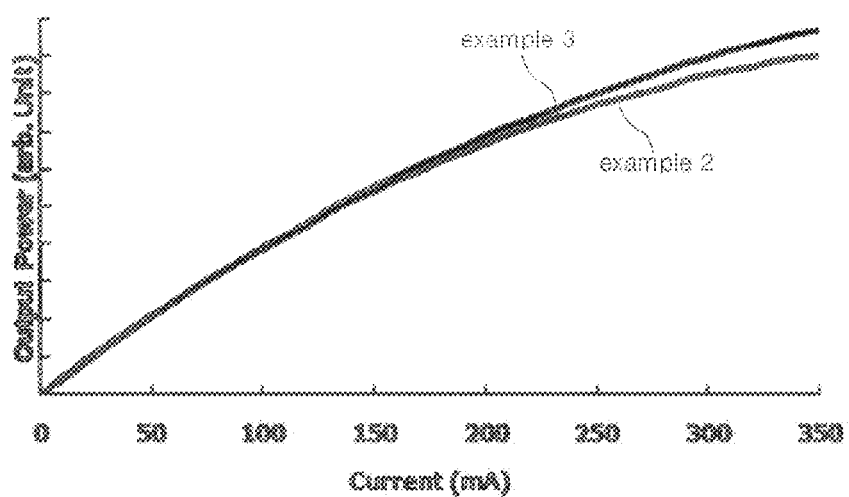
FIG. 23 is a graph depicting current output of light emitting diodes prepared in Light Emitting Diode Preparation Examples 2 and 3.

FIG. 23 is a graph depicting current output of light emitting diodes prepared in Light Emitting Diode Preparation Examples 2 and 3.

Referring to FIG. 23, it can be seen that the light emitting diode of Preparation Example 3 efficiently prevented efficiency droop in a high current range as compared with the light emitting diode of Preparation Example 2. Thus, the light emitting diode of Preparation Example 3, which includes the convex-concave pattern (Convex-concave Pattern Preparation Example 3) formed by secondary wet etching had improved epitaxial crystal quality as compared with the light emitting diode of Preparation Example 2, which includes the convex-concave pattern (Convex-concave Pattern Preparation Example 2) formed by dry etching.

Figure 24A:
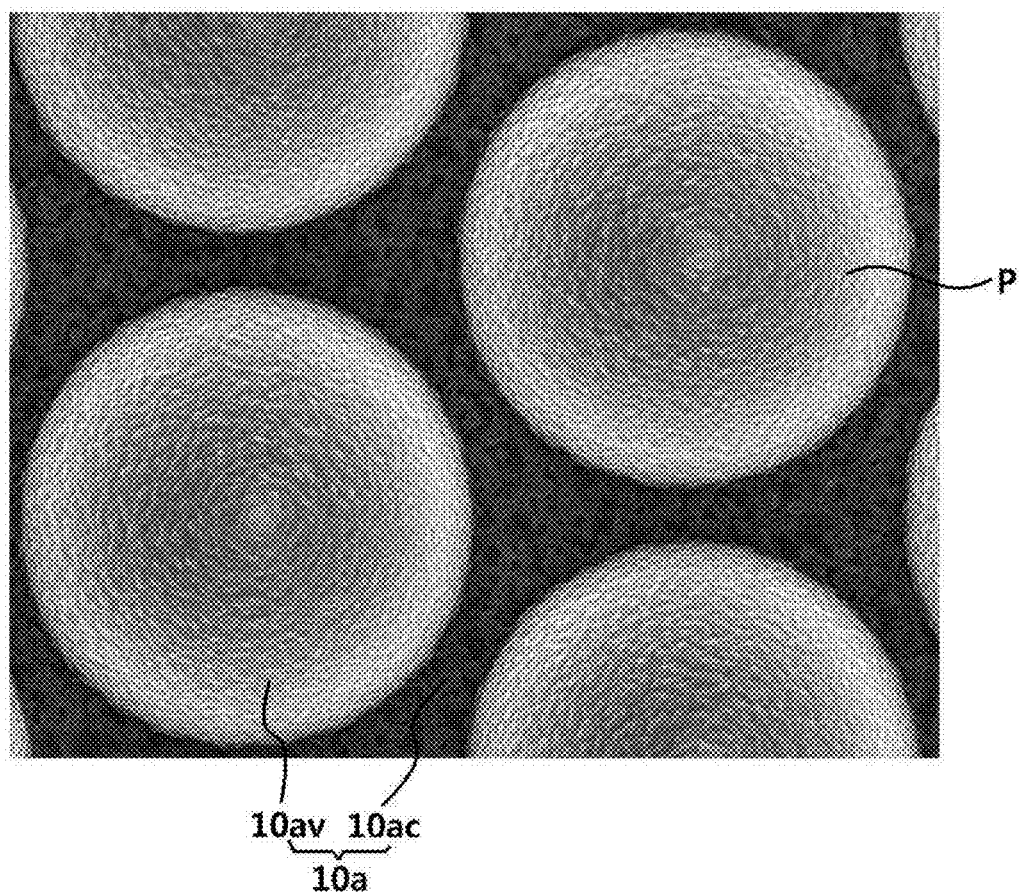
FIG. 24a to FIG. 24b are SEM images of a substrate having a convex-concave pattern prepared in Convex-Concave Pattern Preparation Example 4.
Figure 24B:
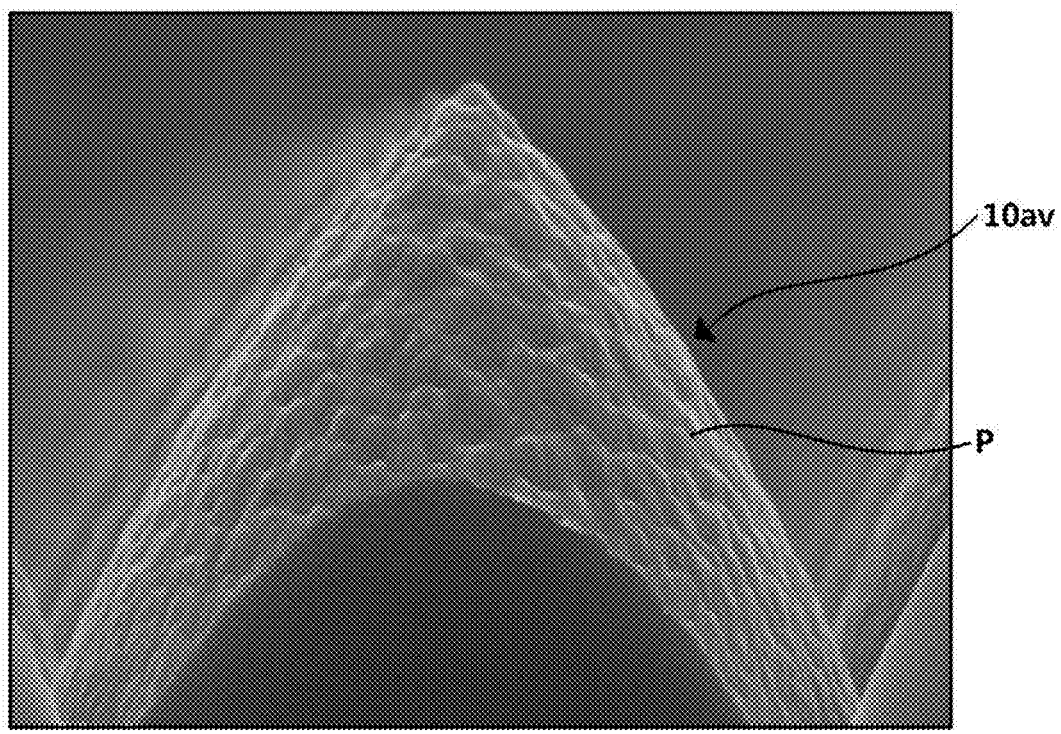

FIG. 24(a) and FIG. 24(b) are SEM images of a substrate having a convex-concave pattern prepared in Convex-Concave Pattern Preparation Example 4.

Referring to FIG. 24(a) and FIG. 24(b), it can be seen that a plurality of fine convexities and concavities P was formed on surfaces of convexities 10av and concavities 10ac of a convex-concave pattern 10a. Such fine convexities and concavities P cause diffuse reflection of light emitted from the active layer, thereby improving light extraction efficiency.

According to exemplary embodiments of the present invention, a light emitting diode includes parallelogram-shaped light emitting units or triangular light emitting units having three acute angles to reduce optical loss occurring at side surfaces of the light emitting units, thereby improving light extraction efficiency. In addition, a convex-concave pattern having fine convexities and concavities is formed in a region of a substrate between the light emitting units, thereby improving light extraction efficiency.

Although the invention has been illustrated with reference to some exemplary embodiments in conjunction with the drawings, it will be apparent to those skilled in the art that various modifications and changes can be made to the invention without departing from the spirit and scope of the invention. Further, it should be understood that some features of a certain exemplary embodiment may also be applied to other exemplary embodiments without departing from the spirit and scope of the invention. Therefore, it should be understood that the exemplary embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

What is claimed is:

1. A light emitting diode, comprising:
   light emitting units disposed on a substrate, the light emitting units comprising a parallelogram-shaped light emitting unit having two acute angles and two obtuse angles and a triangular-shaped light emitting unit having three acute angles; and
   wires connecting the light emitting units to each other.

2. The light emitting diode of claim 1, wherein the light emitting units comprise six parallelogram-shaped light emitting units and one triangular-shaped light emitting unit.

3. The light emitting diode of claim 2, wherein the six parallelogram-shaped light emitting units are arranged in two rows comprising a first row of the light emitting units and a second row of the light emitting units, the first row and the second row comprising a mirror symmetrical structure.

4. The light emitting diode of claim 3, wherein the triangular-shaped light emitting unit is disposed over the first row and the second row, the triangular-shaped light emitting unit being disposed relatively closer to a first side edge of the substrate than remaining side edges of the substrate.

5. The light emitting diode of claim 4, further comprising:
   a first electrode pad disposed in the first row; and
   a second electrode pad disposed in the second row.

6. The light emitting diode of claim 5, wherein the first and second electrode pads are disposed relatively closer to a second side edge of the substrate opposite to the first side edge than remaining side edges of the substrate.

7. The light emitting diode of claim 3, wherein the first row and the second row are arranged such that sides of the light emitting units in respective first and second rows facing each other are parallel to each other.

8. The light emitting diode of claim 1, wherein the parallelogram-shaped light emitting units comprise a first row of the light emitting units oriented in the same direction, and a second row of the light emitting units oriented in the same direction, the triangular-shaped light emitting unit being disposed over the first row and the second row.

9. The light emitting diode of claim 8, wherein the first row and the second row are arranged in a mirror symmetrical structure such that sides of the light emitting units in respective first and second rows facing each other are parallel to each other, and
   wherein one side of the triangular-shaped light emitting unit is parallel to a first side of the light emitting units in the first row, a second side of the triangular-shaped light emitting unit is parallel to one side of the light emitting units in the second row, and a third side of the triangular-shaped light emitting unit is parallel to a first side edge of the substrate.

10. The light emitting diode of claim 1, further comprising:
    a first electrode pad and a second electrode pad,
    wherein the light emitting units form two serial arrays connected in parallel to each other between the first electrode pad and the second electrode pad.

11. The light emitting diode of claim 10, wherein light emitting units disposed between light emitting units at opposite ends of each of the serial arrays comprise the triangular-shaped light emitting units comprising the three acute angles.

12. The light emitting diode of claim 1, wherein each light emitting unit comprises a first conductivity-type semiconductor layer, an active layer, a second conductivity-type semiconductor layer, and a wire connected at a first end thereof to the first conductivity-type semiconductor layer through a groove formed through the second conductivity-type semiconductor layer and the active layer in the light emitting unit.

13. The light emitting diode of claim 1, wherein each light emitting unit comprises a first conductivity-type semiconductor layer, an active layer, a second conductivity-type semiconductor layer, and a wire connected at a first end thereof to the first conductivity-type semiconductor layer exposed to a mesa-etched region of the light emitting unit connected to an isolation groove.

14. The light emitting diode of claim 1, wherein the light emitting units are arranged in a symmetrical structure at opposite sides of an imaginary straight line passing through the center of the substrate.

15. The light emitting diode of claim 1, wherein the substrate comprises a convex-concave pattern comprising convexities and concavities defined by the convexities on an upper surface of the convex-concave pattern, a first portion of the convex-concave pattern disposed in a first region comprising fine convexities and concavities on surfaces of the convex-concave pattern.

16. The light emitting diode of claim 15, wherein the convex-concave pattern comprising fine convexities and concavities formed on the surface thereof is disposed within an isolation groove isolating the light emitting units from each other.

17. The light emitting diode of claim 15, wherein each of the light emitting units comprises a first conductivity-type semiconductor layer, an active layer, and a second conductivity-type semiconductor layer, each of the light emitting units further comprising a mesa-etched region of the second conductivity-type semiconductor layer and the active layer, the mesa-etched region exposing the first conductivity-type semiconductor layer therethrough, and wherein a second portion of the convex-concave pattern comprising fine convexities and concavities is formed on a surface of the convex-concave pattern being disposed under the mesa-etched region.

18. The light emitting diode of claim 15, wherein the convexities of the convex-concave pattern comprise facets comprising crystal planes, and wherein one of the facets comprises an upper vertex.

19. The light emitting diode of claim 18, wherein the facets comprise lower facets corresponding to first crystal planes and upper facets corresponding to second crystal planes, and the upper vertex is disposed where the second crystal planes meet.

20. The light emitting diode of claim 19, wherein an inclined angle of the second crystal planes relative to a surface of the substrate is smaller than an inclined angle of the first crystal planes relative to the surface of the substrate.

21. The light emitting diode of claim 18, wherein the convexities comprise a stripe shape or an island shape.

22. The light emitting diode of claim 21, wherein the convexities comprise an island shape, and a bottom surface of each of the convexities comprises a quasi-triangular shape, each side of which bulges outwards.

23. The light emitting diode of claim 15, wherein each of the convexities of the convex-concave patterns comprises facets corresponding to crystal planes and a flat upper surface.

24. The light emitting diode of claim 15, wherein each of the convexities of the convex-concave pattern comprises lower facets and upper facets comprising different inclined angles.

25. The light emitting diode of claim 15, wherein each of the convexities of the convex-concave pattern comprises lower facets, middle facets, and upper facets, and the facets adjacent each other comprise different inclined angles.

26. The light emitting diode of claim 1, wherein the light emitting units are connected to each other in series via the wires.

27. The light emitting diode of claim 1, further comprising:
a first electrode and a second electrode disposed on each of the light emitting units,
wherein each of the light emitting units comprises a first conductivity-type semiconductor layer, an active layer, and a second conductivity-type semiconductor layer, and
wherein the first electrode is electrically connected to the first conductivity-type semiconductor layer, the second electrode is electrically connected to the second conductivity-type semiconductor layer, and the wires respectively connect the first electrode of one light emitting unit to the second electrode of another light emitting unit.

28. The light emitting diode of claim 27, wherein the second electrode comprises a curved shape.

29. The light emitting diode of claim 28, wherein at least one of the first conductivity-type semiconductor layer, the active layer, and the second conductivity-type semiconductor layer comprises a side surface inclined at an angle of less than 90° relative to a surface of the substrate.

30. A light emitting diode, comprising:
light emitting units arranged on a substrate, the light emitting units comprising a parallelogram-shaped light emitting unit having two acute angles and two obtuse angles and a triangular light emitting unit having three acute angles,
wherein the substrate comprises a convex-concave pattern comprising convexities and concavities defined by the convexities on a first surface of the substrate, and
wherein the convex-concave pattern is disposed in a first region on the first surface of the substrate and comprises fine convexities and concavities disposed on a surface of the convex-concave pattern.

31. The light emitting diode of claim 30, further comprising:
an insulating layer disposed on the light emitting units and the convex-concave pattern on the substrate,
wherein the convex-concave pattern comprising the fine convexities and concavities is disposed in a second region of the substrate contacting the insulating layer.

* * * * *